(12) United States Patent
Yamamoto

(10) Patent No.: US 11,675,193 B2
(45) Date of Patent: Jun. 13, 2023

(54) IMAGE DISPLAY DEVICE AND VIRTUAL IMAGE DISPLAY APPARATUS

(71) Applicant: SEIKO EPSON CORPORATION, Tokyo (JP)

(72) Inventor: Hidetoshi Yamamoto, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 325 days.

(21) Appl. No.: 16/802,721

(22) Filed: Feb. 27, 2020

(65) Prior Publication Data
US 2020/0278549 A1 Sep. 3, 2020

(30) Foreign Application Priority Data

Feb. 28, 2019 (JP) .............................. JP2019-036987

(51) Int. Cl.
*G02B 27/01* (2006.01)
*G02B 27/14* (2006.01)
(Continued)

(52) U.S. Cl.
CPC ....... *G02B 27/0172* (2013.01); *G02B 27/141* (2013.01); *H10K 59/50* (2023.02); *G02B 2027/0114* (2013.01); *G02B 2027/0178* (2013.01); *G09G 3/2007* (2013.01); *G09G 3/3233* (2013.01); *G09G 2310/0213* (2013.01)

(58) Field of Classification Search
CPC .............. G02B 27/017; G02B 27/0172; G02B 27/141; G02B 2027/0114; G02B 2027/0178; G02B 27/149; H01L 27/3232; G09G 3/2007; G09G 3/3233; G09G 2310/0213; G09G 2300/0842;
(Continued)

(56) References Cited

U.S. PATENT DOCUMENTS

2002/0018295 A1* 2/2002 Okuyama ............ G02B 3/0006
359/443
2004/0239658 A1* 12/2004 Koyama ............. H01L 27/3267
345/204
(Continued)

FOREIGN PATENT DOCUMENTS

JP 2000-275732 A 10/2000
JP 2013-179026 A 9/2013

*Primary Examiner* — Nitin Patel
*Assistant Examiner* — Cory A Almeida
(74) *Attorney, Agent, or Firm* — Oliff PLC

(57) ABSTRACT

An image display device according to the present disclosure includes a first self-luminous display element that self-emits an image of first color light, a second self-luminous display element that self-emits an image of second color light, a third self-luminous display element that self-emits an image of third color light, and a prism including a dichroic mirror; the first self-luminous display element includes a first functional layer and a first substrate portion, the second self-luminous display element includes a second functional layer and a second substrate portion, and the third self-luminous display element includes a third functional layer and a third substrate portion; the first, the second, and the third substrate portion have an identical configuration in the thickness directions thereof; and the first, the second, and the third functional layer have a mutually different film thickness.

19 Claims, 17 Drawing Sheets

(51) Int. Cl.
*H10K 59/50* (2023.01)
*G09G 3/20* (2006.01)
*G09G 3/3233* (2016.01)

(58) Field of Classification Search
CPC .......... G09G 2300/0861; H10K 50/85; H10K 50/852; H10K 59/12; H10K 59/50; H10K 59/90
See application file for complete search history.

(56) References Cited

U.S. PATENT DOCUMENTS

| | | | |
|---|---|---|---|
| 2005/0029933 A1* | 2/2005 | Liao | H01L 51/5036 313/503 |
| 2010/0039796 A1* | 2/2010 | Mukawa | G02B 6/0033 362/97.1 |
| 2013/0038640 A1* | 2/2013 | Kajimoto | H01L 51/5218 257/89 |

* cited by examiner

IMAGE DISPLAY DEVICE AND VIRTUAL IMAGE DISPLAY APPARATUS

The present application is based on, and claims priority from JP Application Serial Number 2019-036987, filed Feb. 28, 2019, the present disclosure of which is hereby incorporated by reference herein in its entirety.

BACKGROUND

1. Technical Field

The present disclosure relates to an image display device including a self-luminous display element and a virtual image display apparatus.

2. Related Art

In recent years, as an image display device using a panel including a self-luminous display element, there has been proposed an image display device having a configuration in which panels, including three self-luminous display elements that emit light of colors, such as red color, green color, and blue color, are disposed to face three incident surfaces of a dichroic prism.

In the image display device thus configured, as an image display device in which a panel including a self-luminous display element is configured by an organic electroluminescent panel (an organic EL panel), for example, while red image light emitted from a red color organic electroluminescent panel is reflected by a first dichroic mirror toward an emission surface, the first dichroic mirror transmits blue image light emitted from a blue color organic electroluminescent panel and green image light emitted from a green color organic electroluminescent panel.

In addition, while the blue image light emitted from the blue color organic electroluminescent panel is reflected by a second dichroic mirror toward the emission surface, the second dichroic mirror transmits the red image light emitted from the red color organic electroluminescent panel and the green image light emitted from the green color organic electroluminescent panel.

Accordingly, synthesized light that is a synthesis of the red, green, and blue color images is emitted from the emission surface of the dichroic prism, and the image display device can thus display a color image (for example, JP 2000-275732 A).

Here, in the image display device described in JP 2000-275732 A, the organic EL panels include an organic EL element as a backlight, and further include a liquid crystal display disposed between the organic EL element and the dichroic mirror to form red, green, and blue color images.

JP 2000-275732 A describes that, in the image display device, the organic EL element being a backlight is configured to include a microresonator, to thus cause the organic EL element to emit light of the respective colors such as red, green, and blue colors, however, actually, no description is given about a specific method for adjusting the colors, and thus the method of adjusting the colors needs to be developed.

SUMMARY

The present disclosure is made to address the above-described issues, and can be achieved as the following application example.

An image display device according to an application example of the present disclosure includes a first self-luminous display element that emits by itself an image of first color light having a peak in a first color region, a second self-luminous display element that emits by itself an image of second color light having a peak in the second color region, a third self-luminous display element that emits by itself an image of third color light having a peak in the third color region, and a prism including a dichroic mirror that synthesizes three colors of the first color light emitted from the first self-luminous display element, the second color light emitted from the second self-luminous display element, and the third color light emitted from the third self-luminous display element, wherein the first self-luminous display element, the second self-luminous display element, and the third self-luminous display element each include a support substrate, a reflective film, a light-emitting layer, and a semireflective semitransmissive electrode; the first color light, the second color light, and the third color light are extracted from the semireflective semitransmissive electrode side; the first self-luminous display element includes a first functional layer including the light-emitting layer and a first substrate portion including the reflective film, the second self-luminous display element includes a second functional layer including the light-emitting layer and a second substrate portion including the reflective film, and the third self-luminous display element includes a third functional layer including the light-emitting layer and a third substrate portion including the reflective film; the first substrate portion, the second substrate portion, and the third substrate portion have a same configuration in thickness directions thereof, and the first functional layer, the second functional layer, and the third functional layer each have a mutually different film thickness in thickness direction.

DESCRIPTION OF EXEMPLARY EMBODIMENTS

Figure 1:
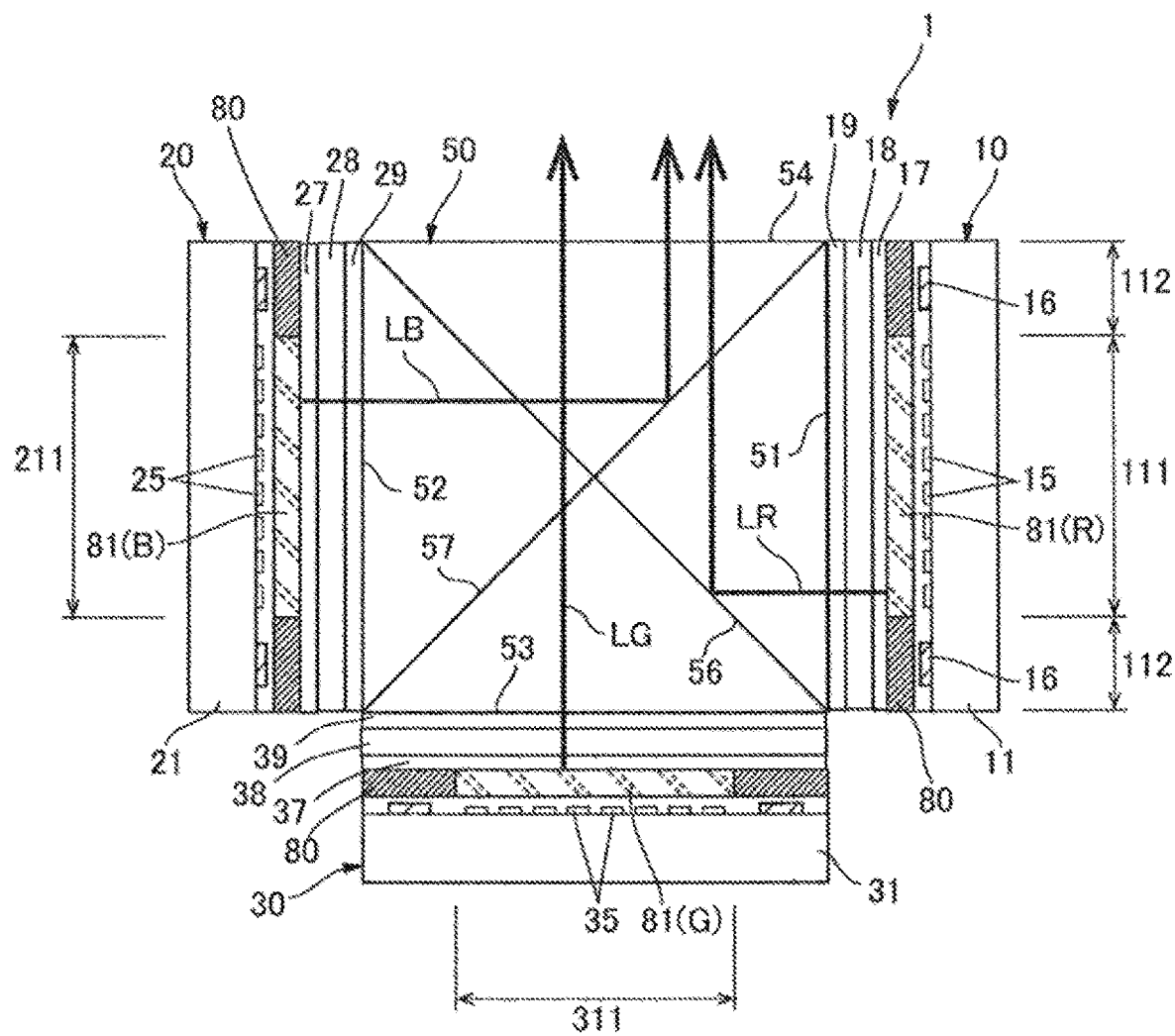
FIG. 1 is a plan view schematically illustrating an image display device according to a first embodiment of the present disclosure.

Hereinafter, an image display device and a virtual image display apparatus of the present disclosure will be described in connection with preferred embodiments illustrated in accompanied drawings.

Note that descriptions will be given below about a case in which the image display device of the present disclosure is applied to a device including an organic electroluminescent element (an organic EL element) as a self-luminous element. In addition, for convenience of explanation, the scale of each of the portions is appropriately varied in the drawings, and the illustrated configuration does not necessarily match the actual scale.

Image Display Device

First Embodiment

Overall Configuration

Figure 2:
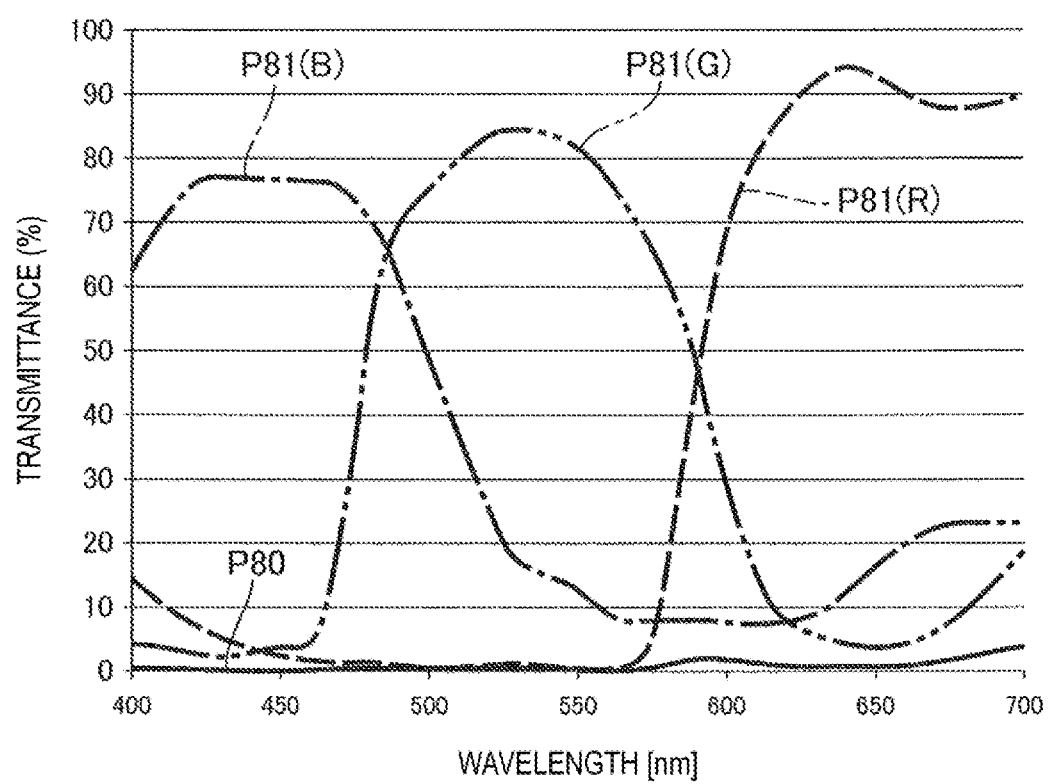
FIG. 2 is a graph illustrating transmittance-wavelength characteristics of a first coloring layer and the like illustrated in FIG. 1.
Figure 3:
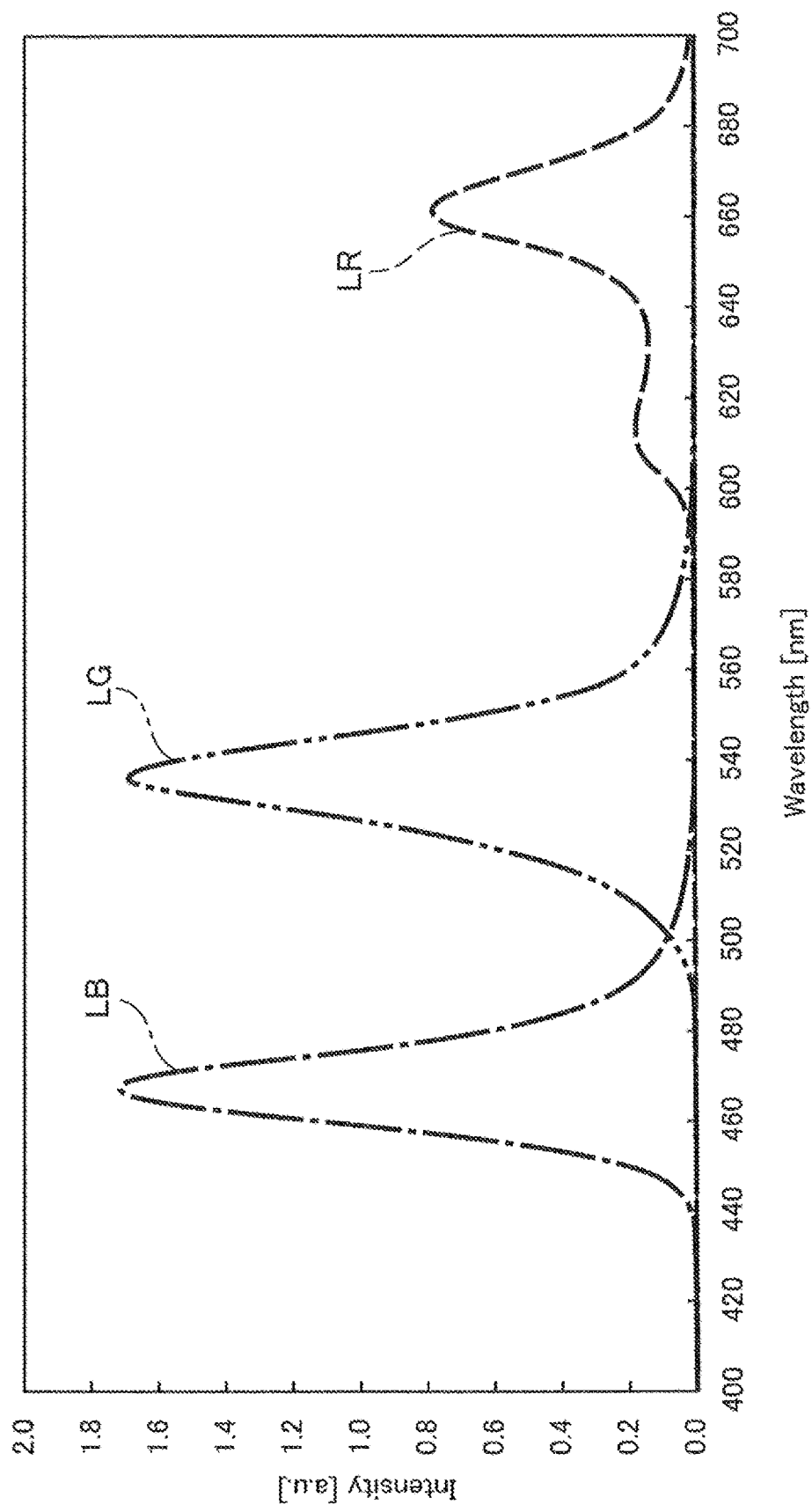
FIG. 3 is a graph illustrating a spectrum of first image light and the like illustrated in FIG. 1.
Figure 4:
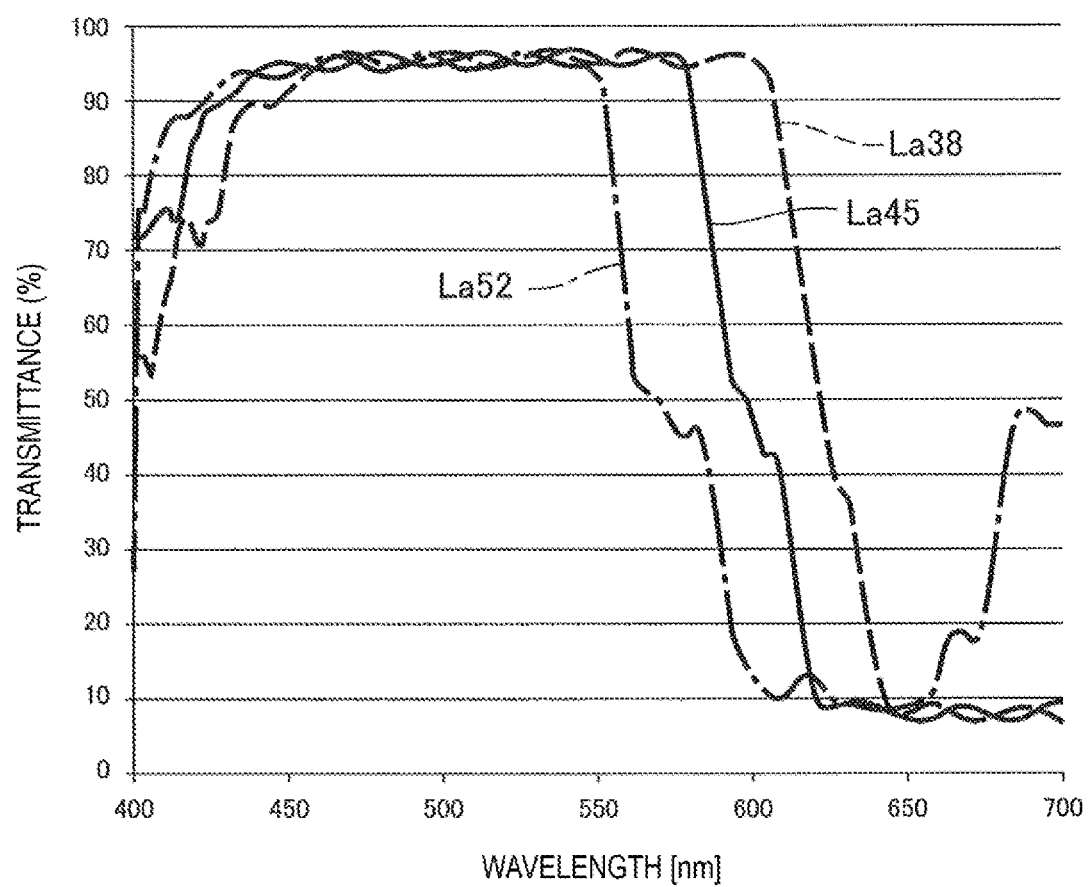
FIG. 4 is a graph illustrating transmittance-wavelength characteristics of a first dichroic mirror illustrated in FIG. 1.
Figure 5:
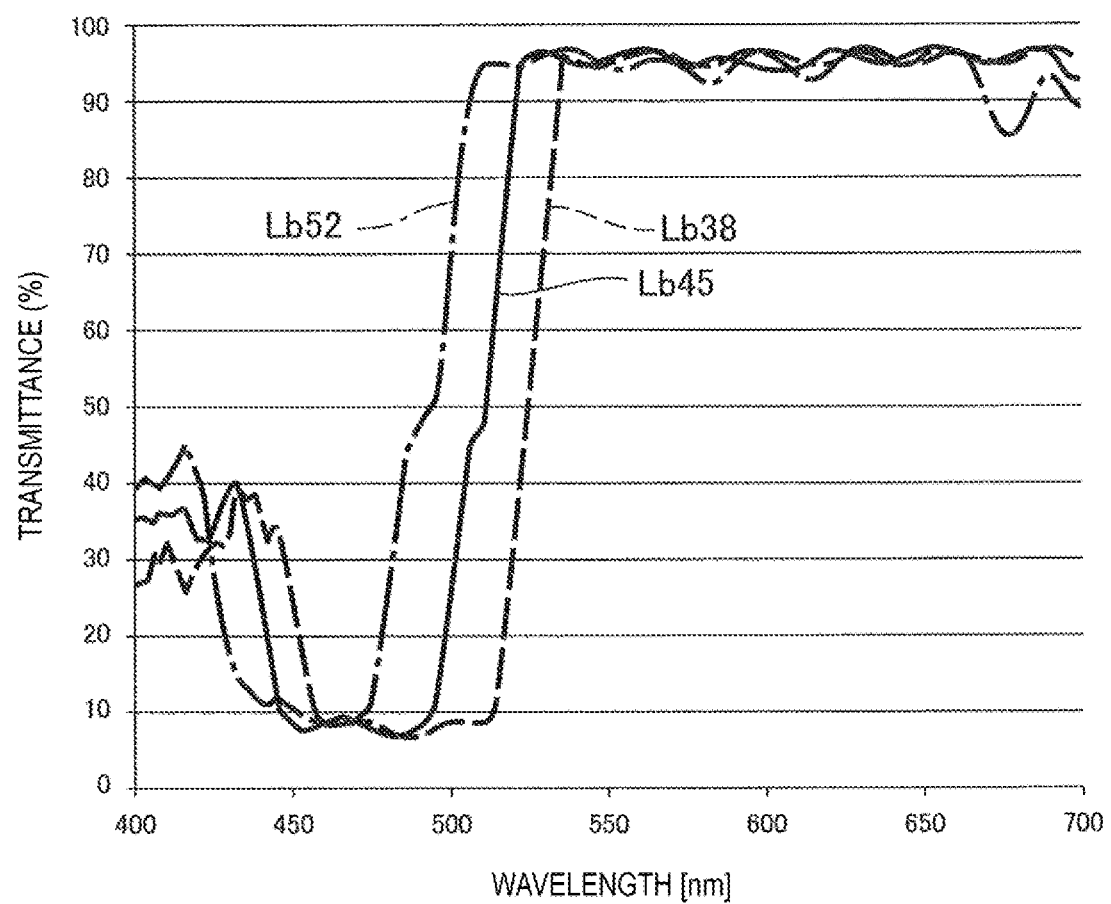
FIG. 5 is a graph illustrating transmittance-wavelength characteristics of a second dichroic mirror illustrated in FIG. 1.

FIG. 1 is a plan view illustrating an image display device of a first embodiment according to the present disclosure. FIG. 2 is a graph illustrating transmittance-wavelength characteristics of a first coloring layer (R) and the like illustrated in FIG. 1. FIG. 3 is a graph illustrating a spectrum of first image light LR and the like illustrated in FIG. 1. FIG. 4 is a graph illustrating transmittance-wavelength characteristics of a first dichroic mirror 56 illustrated in FIG. 1. FIG. 5 is a graph illustrating transmittance-wavelength characteristics of a second dichroic mirror 57 illustrated in FIG. 1.

As illustrated in FIG. 1, an image display device 1 includes a first panel 10 including a plurality of first light-emitting elements 15 in a first display region 111 being a display region of a first substrate 11, a second panel 20 including a plurality of second light-emitting elements 25 in a second display region 211 being a display region of a second substrate 21, a third panel 30 including a plurality of third light-emitting elements 35 in a third display region 311 being a display region of a third substrate 31, and a dichroic prism 50.

The first panel 10 emits first image light LR of first color light having a peak in a first wavelength region from the first display region 111 by self-luminous light of the plurality of first light-emitting elements 15, the second panel 20 emits second image light LB of second color light having a peak in a second wavelength region from the second display region 211 by self-luminous light of the plurality of second light-emitting elements 25, and the third panel 30 emits third image light LG of third color light having a peak in a third wavelength region from the third display region 311 by self-luminous light of the plurality of third light-emitting elements 35. Note that the first wavelength region, the second wavelength region, and the third wavelength region are different from one another, and may have an overlapped range in some partial regions.

In the first embodiment, the first wavelength region ranges, for example, from 620 nm to 750 nm, and the first panel 10 has a peak in this region and emits the first image light LR of red color light being the first color light. Further, the second wavelength region ranges, for example, from 450 nm to 495 nm, and the second panel 20 has a peak in this region and emits the second image light LB of blue color light being the second color light. Moreover, the third wavelength region ranges, for example, from 495 nm to 570 nm, and the third panel 30 has a peak in this region and emits the third image light LG of green color light being the third color light. That is, the first panel 10 emits the first image light LR of red color light having a long wavelength, the second panel 20 emits the second image light LB of blue color light having a shorter wavelength than the wavelength of the first image light LR, and the third panel 30 emits the third image light LG of green color light having a medium wavelength between the first image light LR and the second image light LB.

In the image display device 1 thus configured, the first panel 10 emits red image light by self-luminous light of the plurality of first light-emitting elements 15 provided in the first display region 111, and includes, further at the first substrate 11, on a side of the dichroic prism 50 with respect to the first light-emitting elements 15, a first coloring layer 81(R) that can selectively transmit red image light emitted from the first light-emitting elements 15, that is, the first image light LR in the first wavelength region.

Further, the second panel 20 emits blue image light by self-luminous light of the plurality of second light-emitting elements 25 provided in the second display region 211, and the second panel 20 includes, further at the second substrate 21, on a side of the dichroic prism 50 with respect to the second light-emitting elements 25, a second coloring layer 81(B) that can selectively transmit blue image light emitted from the second light-emitting elements 25, that is, the second image light LB in the second wavelength region.

Moreover, the third panel 30 emits green image light by self-luminous light of the plurality of third light-emitting elements 35 provided in the third display region 311, and the third panel 30 includes, further at the third substrate 31, on a side of the dichroic prism 50 with respect to the third light-emitting elements 35, a third coloring layer 81(G) that can selectively transmit green image light emitted from the third light-emitting elements 35, that is, the third image light LG in the third wavelength region.

In addition, in the first embodiment, the first light-emitting elements 15, the second light-emitting elements 25, and the third light-emitting elements 35 included in the first panel 10, the second panel 20, and the third panel 30, are all configured by an organic electroluminescent element, where the plurality of first light-emitting elements 15, the plurality of second light-emitting elements 25, and the plurality of third light-emitting elements 35 emit red image light, blue image light, and green image light, respectively. That is, in the panels 10, 20, and 30 of the first embodiment, the plurality of first light-emitting elements 15 constitute the first self-luminous display element that self-emits red image light being the first color, further, the plurality of second light-emitting elements 25 constitute the second self-luminous display element that self-emits blue image light being the second color, and in addition, the plurality of third light-emitting elements 35 constitute the third self-luminous display element that self-emits green image light being the third color.

Further, the first coloring layer 81(R), which has, for example, the transmittance-wavelength characteristics indicated by a dashed line P81(R) as illustrated in FIG. 2, forms a light-absorbing filter layer that absorbs light other than the red color light. Next, the second coloring layer 81(B), which has the transmittance-wavelength characteristics indicated by a one-dot chain line P81(B), forms a light-absorbing filter layer that absorbs light other than the blue color light. Next, the third coloring layer 81(G), which has the transmittance-wavelength characteristics indicated by a two-dot chain line P81(G), forms a light-absorbing filter layer that absorbs light other than the green color light.

Accordingly, as illustrated in FIG. 3, the first image light LR represents red image light having a spectrum indicated by a dashed line LR by an action between the first light-emitting elements 15 and the first coloring layer 81(R), the second image light LB represents blue image light having a spectrum indicated by a dot-dash line LB by an action between the second light-emitting elements 25 and the second coloring layer 81(B), and the third image light LG represents green image light having a spectrum indicated by a two-dot chain line LG by an action of the third light-emitting elements 35 and the third coloring layer 81(G).

The dichroic prism 50 (a prism) includes a first incident surface 51, a second incident surface 52 facing the first incident surface 51, a third incident surface 53 provided between the first incident surface 51 and the second incident surface 52, and an emission surface 54 facing the third incident surface 53. The first panel 10 is arranged to face the first incident surface 51, where the first image light LR of red color light being the first color light emitted from the first panel 10 is incident on the first incident surface 51. The second panel 20 is arranged to face the second incident surface 52, and the second image light LB of blue color light being the second color light emitted from the second panel 20 is incident on the second incident surface 52. The third panel 30 is arranged to face the third incident surface 53, and the third image light LG of green color light being the third color light emitted from the third panel 30 is incident on the third incident surface 53. Further, the first incident surface 51 is fixed to the first panel 10 via an adhesive 19 having light-transmissivity, the second incident surface 52 is fixed to the second panel 20 via an adhesive 29 having light-transmissivity, and the third incident surface 53 is fixed to the third panel 30 via an adhesive 39 having light-transmissivity.

The dichroic prism 50 also includes the first dichroic mirror 56 and the second dichroic mirror 57 arranged to intersect each other at 45 degrees angle.

As indicated by a solid line La45 illustrated in FIG. 4, as for the light being incident at 45 degrees angle, for example, the first dichroic mirror 56 transmits light having a wavelength of approximately 550 nm or less and reflects light having a wavelength of approximately 600 nm or greater. Further, as for the light having a wavelength from 550 nm to 600 nm, a longer wavelength lowers the transmittance. Accordingly, the first dichroic mirror 56 reflects the first image light LR toward the emission surface 54 and transmits the second image light LB and the third image light LG.

Further, as indicated by a solid line Lb45 in FIG. 5, as for the light being incident at 45 degrees angle, for example, the second dichroic mirror 57 transmits light having a wavelength of approximately 520 nm or greater and reflects light having a wavelength of approximately 490 nm or less. In addition, as for the light having a wavelength from 490 nm to 520 nm, a longer wavelength increases the transmittance. Accordingly, the second dichroic mirror 57 reflects the second image light LB toward the emission surface 54 and transmits the first image light LR and the third image light LG. Thus, three colors of light, which are the first image light LR of red color light being the first color light emitted from the first panel 10, the second image light LB of blue color light being the second color light emitted from the second panel 20, and the third image light LG of green color light being the third color light emitted from the third panel 30, are synthesized to be a color image by an action of the first dichroic mirror 56 and the second dichroic mirror 57. The dichroic prism 50 emits the color image from the emission surface 54.

Note that the transmittance and reflectance of the first dichroic mirror 56 are incident angle dependent. For example, as for the first dichroic mirror 56, as indicated by a dashed line La38 illustrated in FIG. 4, the wavelength region of transmission shifts to the longer wavelength side in case of the incident angle being 38 degrees than in case of the incident angle being 45 degrees, and as indicated by a one-dot chain line La52 in FIG. 4, the wavelength region of transmission shifts to the shorter wavelength side in case of the incident angle being 52 degrees than in case of the incident angle being 45 degrees.

Further, as in the first dichroic mirror 56, the transmittance and reflectance of the second dichroic mirror 57 are incident angle dependent. For example, as for the second dichroic mirror 57, as indicated by a dashed line Lb38 illustrated in FIG. 5, the wavelength region of transmission shifts to the longer wavelength side in case of the incident angle being 38 degrees than in case of the incident angle being 45 degrees, and as indicated by a one-dot chain line Lb52 in FIG. 5, the wavelength region of transmission shifts to the shorter wavelength side in case of the incident angle being 52 degrees than in case of the incident angle being 45 degrees.

Electrical Configuration of First Panel 10

Figure 6:
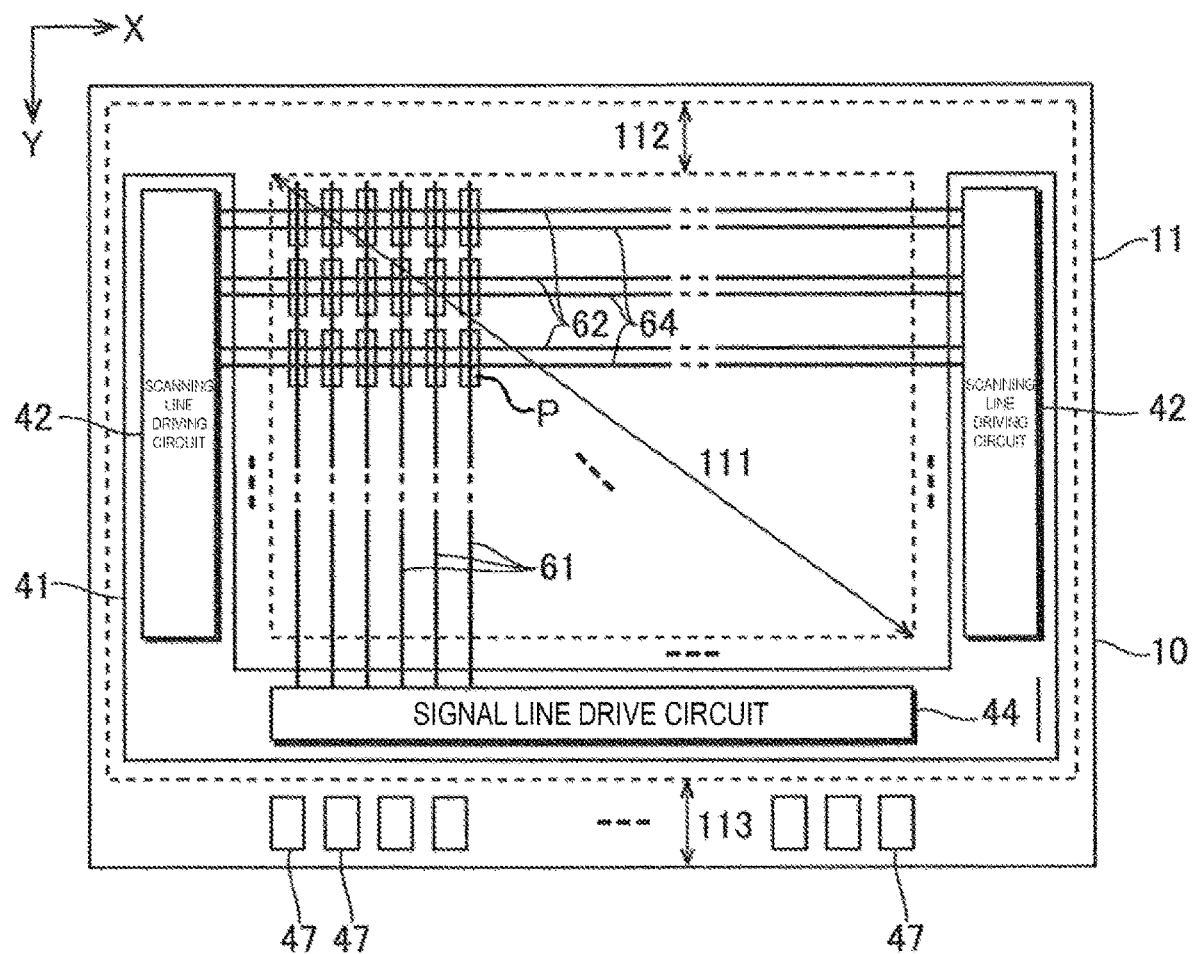
FIG. 6 is an explanatory diagram illustrating an electrical configuration of a first panel illustrated in FIG. 1.
Figure 7:
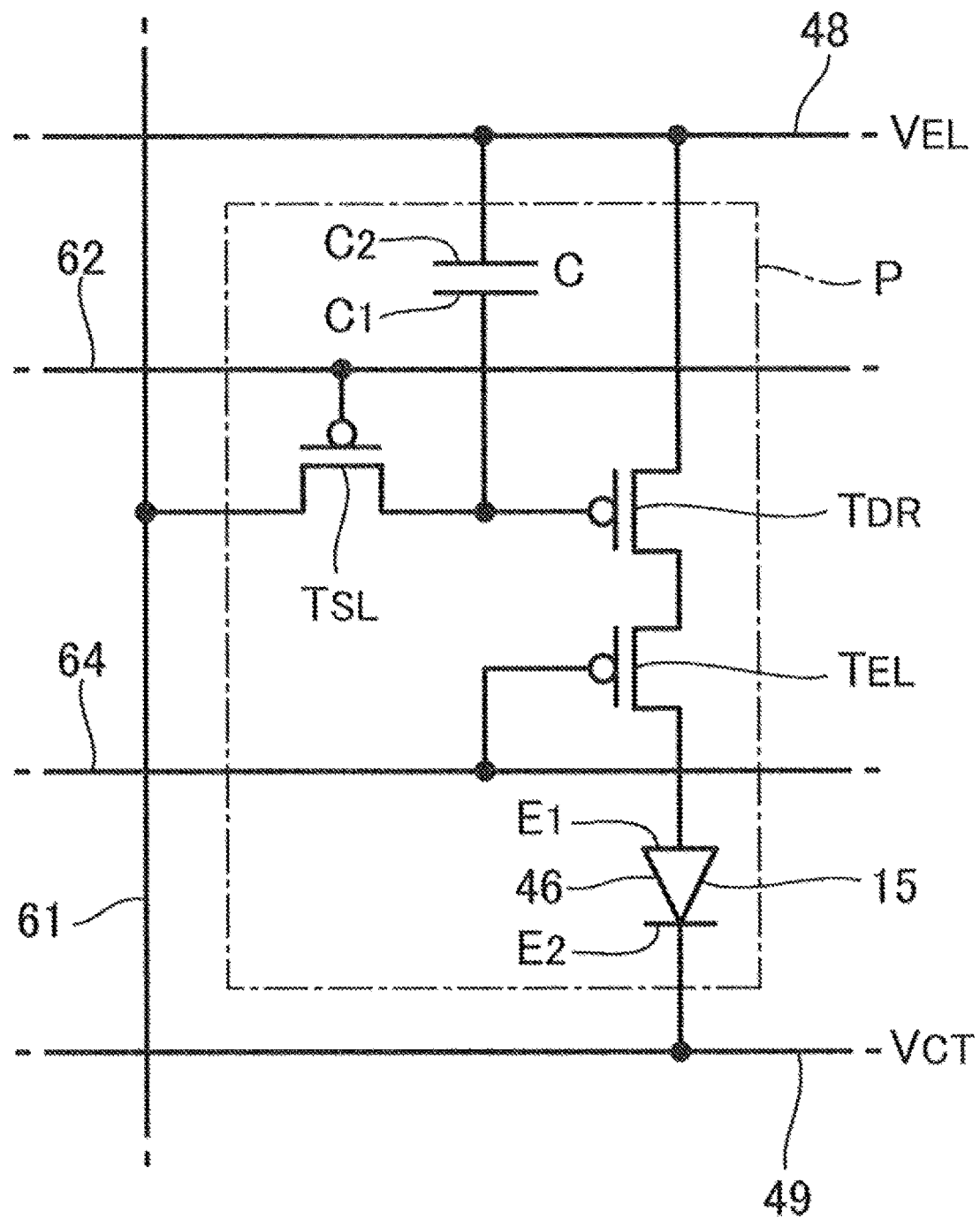
FIG. 7 is a circuit diagram of pixels (pixel circuits) within a first display region illustrated in FIG. 6.

FIG. 6 is an explanatory diagram illustrating an electrical configuration of the first panel 10 illustrated in FIG. 1. FIG. 7 is a circuit diagram of pixels (pixel circuits) within the first display region 111 illustrated in FIG. 6. Note that, for easy understanding of the description, descriptions will be given below assuming that in FIG. 6, the front side of the page is "upper" and the back side of the page is "lower".

As illustrated in FIG. 6, the first panel 10 includes the first display region 111, a peripheral region 112, and a mounting region 113 on the upper surface, that is, one surface of the first substrate 11. In the first embodiment, in the first panel 10, the first substrate 11 is constituted by a semiconductor substrate such as a silicon. In the first substrate 11, the first display region 111 is a rectangular region in which a plurality of pixels P are arrayed. In the first display region 111, there are formed a plurality of scanning lines 62 extending in an X direction, a plurality of control lines 64 extending in the X direction corresponding to the scanning lines 62, and a plurality of signal lines 61 extending in a Y direction intersecting the X direction. The pixels P are formed corresponding to the intersections between the plurality of scanning lines 62 and the plurality of signal lines 61. Accordingly, the plurality of pixels P are arrayed in a matrix pattern, that is, in a lattice pattern across the X direction and the Y direction.

The peripheral region 112 is a rectangular frame-shaped region that surrounds the circumference of the first display region 111. A drive circuit 41 is provided in the peripheral region 112. The drive circuit 41 is a circuit that drives the pixels P within the first display region 111, and is configured to include two scanning line drive circuits 42 and a signal line drive circuit 44. The first panel 10 of the first embodiment is a circuit incorporating display device in which the drive circuit 41 is configured by active elements, such as transistors, formed directly on the surface of the first substrate 11.

The mounting region 113 is a region on the opposite side of the first display region 111 with the peripheral region 112 interposed in between, where a plurality of mounting terminals 47 are arrayed. The mounting terminals 47 are supplied with a control signal and a power supply potential from various external circuits such as a control circuit and a power supply circuit, which are not illustrated. The external circuits are mounted on a non-illustrated flexible circuit board, which is bonded to the mounting region 113, for example.

Further, as illustrated in FIG. 7, the pixel P is configured to include the first light-emitting element 15, a drive transistor TDR, a light emission control transistor TEL, a selection transistor TSL, and a capacitance element C. Note that, although in FIG. 7, the transistors TDR, TEL, and TSL of the pixel P are transistors of P-channel type, transistors of N-channel type may also be used.

The first light-emitting element 15 is an organic EL element, that is, an electro-optical element in which a light-emitting functional layer 46 including a light-emitting layer of an organic EL material is interposed between a first electrode E1 (an anode) and a second electrode E2 (a cathode). The first electrode E1 is formed individually for each of the pixels P, and the second electrode E2 is continuous across the plurality of pixels P. The first light-emitting element 15 is disposed on a current path that couples a first power supply conductor 48 and a second power supply conductor 49. The first power supply conductor 48 is a power supply line to which a higher-side power supply potential (a first potential) VEL is supplied, and the second power supply conductor 49 is a power supply line to which a lower-side power supply potential (a second potential) VCT is supplied.

The drive transistor TDR and the light emission control transistor TEL are arranged on the current path, which couples the first power supply conductor 48 and the second power supply conductor 49, in series with the first light-emitting element 15. Specifically, one (the source) of a pair of current terminals of the drive transistor TDR is coupled to the first power supply conductor 48. The light emission control transistor TEL functions as a switch that controls a conductive state (conductive/non-conductive) between the other (the drain) of the pair of current terminals of the drive transistor TDR, and the first electrode E1 of the first light-emitting element 15. The drive transistor TDR generates a drive current of an amount of the current corresponding to a voltage between the gate and source of the drive transistor TDR. In a state where the light emission control transistor TEL is controlled to be in an ON state, the drive current is supplied from the drive transistor TDR, via the light emission control transistor TEL, to the first light-emitting element 15, to thus cause the first light-emitting element 15 to emit light at a luminance corresponding to the amount of the current of the drive current. In a state where the light emission control transistor TEL is controlled to be in an OFF state, the supply of the drive current to the first light-emitting element 15 is cut off, to thus cause the first light-emitting element 15 to be turned off. The gate of the light emission control transistor TEL is coupled to the control line 64.

The selection transistor TSL functions as a switch that controls a conductive state (conductive/non-conductive) between the signal line 61 and the gate of the drive transistor TDR. The gate of the selection transistor TSL is coupled to the scanning line 62. Further, the capacitance element C is an electrostatic capacitance with a dielectric substance interposed between a first electrode C1 and a second electrode C2. The first electrode C1 is coupled to the gate of the drive transistor TDR, and the second electrode C2 is coupled to the first power supply conductor 48 (the source of the drive transistor TDR). Accordingly, the capacitance element C holds the voltage between the gate and source of the drive transistor TDR.

The signal line drive circuit 44 supplies a grayscale potential that accords with a grayscale specified for each of the pixels P by an image signal supplied from the external circuit, to the plurality of signal lines 61, in parallel, for each of the write periods (horizontal scanning periods). On the other hand, each of the scanning line drive circuits 42 supplies a scanning signal to each of the scanning lines 62, to thus sequentially select each of the plurality of scanning lines 62 for each of the write periods. The selection transistor TSL of the pixels P corresponding to the scanning line 62 selected by the scanning line drive circuit 42 switches to an ON state. Accordingly, the grayscale potential is supplied to the gate of the drive transistor TDR of each of the pixels P, via the signal line 61 and the selection transistor TSL, and a voltage that accords with the grayscale potential is held in the capacitance element C. On the other hand, upon termination of the selection of the scanning lines 62 in the write period, each of the scanning line drive circuits 42 supplies a control signal to each of the control lines 64, to thus control the light emission control transistor TEL of each of the pixels P corresponding to the control line 64 to be in an ON state. Accordingly, a drive current that accords with the voltage held in the capacitance element C in the immediately preceding write period is supplied from the drive transistor TDR, via the light emission control transistor TEL, to the first light-emitting element 15. In this way, the first light-emitting element 15 emits light at a luminance that accords with the grayscale potential, to thus cause the first image light LR arbitrarily specified by the image signal to be emitted from the first display region 111. That is, the first panel 10 having such an electrical configuration causes the first image light LR as desired to be emitted using the plurality of first light-emitting elements 15 singly without using a liquid crystal panel.

Cross-Sectional Configuration of First Panel 10

Figure 8:
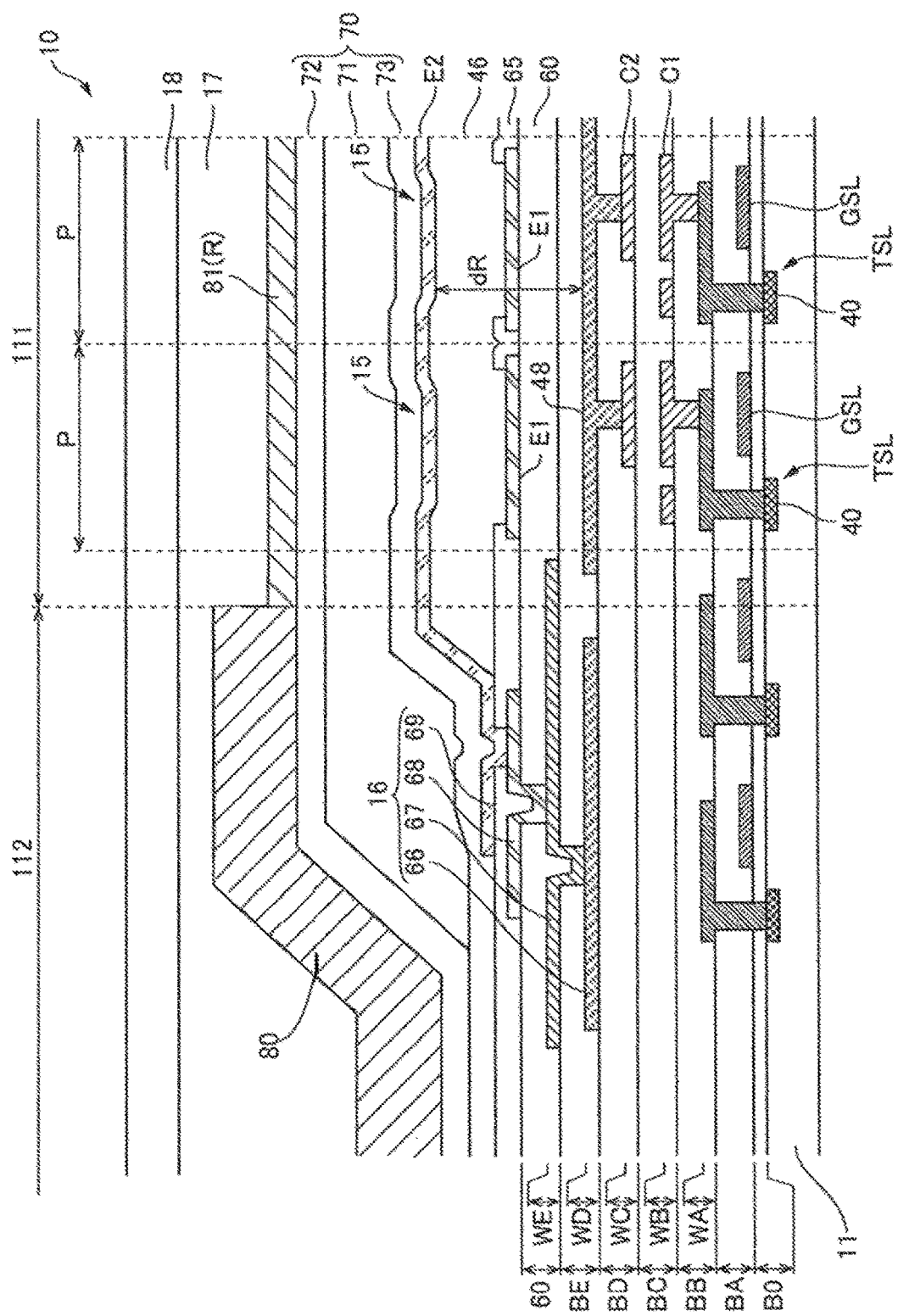
FIG. 8 is a cross-sectional view of a first panel illustrated in FIG. 1.

FIG. 8 is a cross-sectional view of the first panel 10 illustrated in FIG. 1. Note that, for easy understanding of the description, descriptions will be given below assuming that in FIG. 8, the upper side is "upper" and the lower side is "lower".

As illustrated in FIG. 8, an active region 40 (source/drain regions) of a transistor, such as the selection transistor TSL of the pixel P, is formed at the first substrate 11, and the upper surface of the active region 40 is covered by an insulating film BO (a gate insulating film). A gate electrode GSL is formed at the upper surface of the insulating film BO. On the upper layer side of the gate electrode GSL, a multilayer wiring layer is formed, in which a plurality of insulating layers BA to BE and a plurality of wiring layers WA to WE are alternately layered. Each of the wiring layers is formed of a low-resistance conductive material containing aluminum, silver, or the like. The wiring layer WA including the scanning lines 62 and the like illustrated in FIG. 7 is formed at the upper surface of the insulating layer BA. The wiring layer WB including the signal lines 61, the first electrode C1 and the like illustrated in FIG. 7 is formed at the upper layer of the insulating layer BB. The wiring layer WC including the second electrode C2 and the like illustrated in FIG. 7 is formed at the surface-upper layer of the insulating layer BC. The wiring layer WD including the first power supply conductor 48 and the like illustrated in FIG. 7 is formed at the surface-upper layer of the insulating layer BD. The wiring layer WE including a wiring 69, a wiring 67, and the like is formed at the upper layer of the insulating layer BE. Note that in the first embodiment, a support substrate in the image display device 1 is configured by the first substrate 11, the insulating film BO, the gate electrode GSL, the insulating layers BA to BD, and the wiring layers WA to WC, which are described above.

Further, an optical adjustment layer 60 is formed at the upper layer of the insulating layer BE. The optical adjustment layer 60, that is, an optical path adjusting layer, is one of the elements that are used to set a resonance wavelength of an optical resonator to an adequate wavelength, and is formed of a light-transmissive insulating material of silicon nitride, silicon dioxide, or the like. Specifically, in the first embodiment, the first power supply conductor 48 being a reflective film, the insulating layer BE, the optical adjustment layer 60, the first electrode E1 being a transparent electrode, the light-emitting functional layer 46 including a light-emitting layer, and the second electrode E2 being a semireflective semitransmissive electrode configure the optical resonator, that is, the microresonator. An optical path length dR (an optical distance) between the first power supply conductor 48 and the second electrode E2 in this optical resonator is appropriately adjusted in accordance with the film thickness of each of the layers, and particularly in the present disclosure, the optical path length dR is appropriately adjusted in accordance with the film thickness of the light-emitting functional layer 46, that is, a first functional layer. This allows, in the first panel 10, the first color light to be extracted from a side of the second electrode E2, thus setting a resonance wavelength of the light emitted from the first panel 10. Note that a method for adjusting the optical path length dR (an optical distance) in accordance with the film thickness of the light-emitting functional layer 46, that is, the first functional layer, will be described later in detail. Further, in the first embodiment, the first image light LR of red color light being the first color light is emitted from the first panel 10, thus, the optical path length dR of the optical resonator is set to an adequate value, that is, an adequate distance for the first image light LR. In addition, in the first panel 10, the first color light is extracted from the side of the second electrode E2, to thus configure the first light-emitting element 15 of a top-emission type.

More specifically, the first electrode E1 is formed at the upper surface of the optical adjustment layer 60, for each of the pixels P within the first display region 111. The first electrode E1, which constitutes a transparent electrode, is formed of a light-transmissive conductive material such as indium tin complex oxide (ITO) or indium zinc complex oxide (IZO), for example. A pixel defining layer 65 having an insulating property is formed around the first electrode E1. The light-emitting functional layer 46 is formed at the upper surface of the first electrode E1.

The light-emitting functional layer 46, that is, the first functional layer, is constituted by an organic layer that includes the light-emitting layer formed containing an organic EL material that emits red color light, and radiates red color light, that is, emits light as a result of a supply of current. Note that the light-emitting functional layer 46 may be constituted by a laminated body provided with a transport layer or an injection layer for electrons or positive holes supplied to the light-emitting layer. In the first embodiment, the light-emitting functional layer 46 is formed continuously across the plurality of pixels P within the first display region 111.

The second electrode E2 being a semireflective semitransmissive electrode is formed at the upper layer of the light-emitting functional layer 46, over the entire area of the first display region 111, where in the light-emitting functional layer 46, a region interposed between the first electrode E1 and the second electrode E2 (a light-emitting region) emits light. Further, the second electrode E2 transmits part of the light having reached the second electrode E2, as well as functions as a semireflective semitransmissive layer that reflects the rest. More specifically, a photoreflective conductive material, such as an alloy containing silver or magnesium, is formed into a sufficiently thin film, to thus form the second electrode E2, as a semireflective semitransmissive electrode having semireflective semitransmissive properties. Accordingly, the radiated light from the light-emitting functional layer 46 reciprocates between the first power supply conductor 48 being a reflective film and the second electrode E2 being a semireflective semitransmissive electrode. As a result, the first image light LR of red color light being the first color light as a component of a particular resonance wavelength is selectively amplified and then the reciprocating light passes through the second electrode E2 to be emitted to an observation side (the opposite side from the first substrate 11). That is, the respective layers, which are the first power supply conductor 48, the insulating layer BE, the optical adjustment layer 60, the first electrode E1, the light-emitting functional layer 46 including a light-emitting layer, and the second electrode E2, form the optical resonator that causes light emitted from the light-emitting functional layer 46 to resonate between the first power supply conductor 48 that functions as a reflective film and the second electrode E2 that functions as a semireflective semitransmissive electrode.

Note that in the first embodiment, in the first panel 10, among the layers that configure the optical resonator, a first substrate portion is constituted by the first power supply conductor 48 being a reflective film, the insulating layer BE, the optical adjustment layer 60, and the first electrode E1 being a transparent electrode.

Further, in the present disclosure, it suffices that the optical adjustment layer 60 be composed of a light-transmissive insulating material such as silicon nitride, silicon dioxide, or the like. The optical adjustment layer 60 may be a single layer body, or a laminated body, which contains these materials, where when the optical adjustment layer 60 is constituted by the laminated body, the optical adjustment layer 60 may also be referred to as optical adjustment layer with the insulating layer BE and the optical adjustment layer 60, including the insulating layer BE.

Moreover, in the peripheral region 112, a metal wiring 16 including wirings 66, 67, 68, and 69, and the like is formed in the same layers as the conductive layers formed in the first display region 111, where the wirings 66, 67, 68, and 69 are electrically coupled via contact holes through insulating layers, which are formed between the wirings, for example.

On the upper layer side of the second electrode E2, a sealing body 70 is formed over the entire area of the first substrate 11. The sealing body 70, which is a light-transmissive film body that seals the elements formed over the first substrate 11 to prevent infiltration of outside air and moisture, is constituted, in the first embodiment, by layered films of a first sealing layer 71, a second sealing layer 72, and a third sealing layer 73. The third sealing layer 73, which is formed at the upper layer of the second electrode E2, is in direct contact with the upper surface of the second electrode E2. The third sealing layer 73 contains an insulating inorganic material such as a silicon compound (typically, silicon nitride or silicon oxide), for example. Further, the first sealing layer 71 functions as a flattening film that buries level differences of the surfaces of the second electrode E2 and the third sealing layer 73. The first sealing layer 71 is formed of a light-transmissive organic material such as an epoxy resin, for example. Moreover, the second sealing layer 72 is formed over the entire area of the first substrate 11. The second sealing layer 72 is formed of a silicon nitride, a silicon oxynitride, or the like, which provides excellent water-resistant and heat-resistant properties, for example.

Further, on the top surface of the sealing body 70 (the second sealing layer 72), in the first display region 111, the first coloring layer 81(R) is formed, and in the peripheral region 112, a blocking layer 80 is formed. This allows, in the first display region 111, the first coloring layer 81(R) to transmit red color light in the first wavelength region, and allows, in the peripheral region 112, the blocking layer 80 to block the red color light in the first wavelength region.

Further, in the first panel 10, a cover substrate 18 having light-transmissivity is fixed, with an adhesive 17, to the first coloring layer 81(R) and the blocking layer 80, on the opposite side of the first substrate 11. This allows the cover substrate 18 to protect the first coloring layer 81(R) and the blocking layer 80.

Moreover, in the first embodiment, in the first panel 10 having such a configuration, the first light-emitting element 15 is constituted, as described above, by an organic EL element in which the light-emitting functional layer 46 including a light-emitting layer of organic EL material is interposed between the first electrode E1 (an anode) and the second electrode E2 (a cathode). The light-emitting functional layer 46 is constituted by a laminated body in which a light-emitting layer (a red light-emitting layer), an electron transport layer, and an electron injection layer are layered in this order from a side of the first electrode E1 (an anode), for example. Each of the layers constituting the first light-emitting element 15 will be described below.

First Electrode E1 (Anode)

The first electrode E1 (an anode) is an electrode that injects holes into the light-emitting layer. As a constituent material of the first electrode E1, a material having a large work function and excellent conductivity may be used.

Examples of the constituent material of the first electrode E1 include, for example, oxides such as Indium Tin Oxide (ITO), Indium Zinc Oxide (IZO), $In_2O_3$, $SnO_2$, Sb-containing $SnO_2$, Al-containing ZnO, Au, Pt, Pt, Ag, Cu, or alloys or the like containing these metals. These can be used in one type or in combination of two types or more.

The average thickness of the first electrode E1 thus configured is not particularly limited, and it is preferred that the thickness range approximately from 10 nm to 200 nm, and it is more preferred that the thickness range approximately from 50 nm to 150 nm.

Second Electrode E2 (Anode)

A second electrode E2 (an anode) is an electrode that injects electrons into an electron transport layer via an electron injection layer. As a constituent material of the second electrode E2, a material having a small work function may be used.

Examples of the constituent material of the second electrode E2 include, for example, Li, Mg, Ca, Sr, La, Ce, Er, Eu, Sc, Y, Yb, Ag, Cu, Al, Cs, Rb, or alloys or the like containing these metals. These can be used in one type or in combination of two types or more (for example, a laminated body of multiple layers, and the like).

Light-Emitting Layer (Red Light-Emitting Layer)

In the first light-emitting element 15, the light-emitting layer is constituted by a red light-emitting layer that emits red-luminous light, and is configured to include a red luminescent material (an organic EL material) that emits red color light, and a host material that holds the red luminescent material, for example.

Such a red luminescent material is not particularly limited, and for the red luminescent material, various types of red fluorescent materials and red phosphorescent materials can be used in one type or in combination of two types or more.

Examples of the red fluorescent material include, without being particularly limited as long as being a material that emits red fluorescent light, perylene derivatives such as a tetraaryldiindenoperylene derivative, europium complexes, benzopyran derivatives, rhodamine derivatives, benzothioxanthene derivatives, porphyrin derivatives, nile red, 4-(dicyanomethylene)-2-tert-butyl-6-(1,1,7,7-tetramethyljulolidin-4-yl-vinyl)-4H-pyran (DCJTB), (E)-2-(2-(4-(dimethylamino)styryl)-6-methyl-4H-pyran-4-ylidene) malononitrile (DCM), and the like.

Examples of the red phosphorescent material include, without being particularly limited as long as being a material that emits red phosphorescent light, metal complexes such as iridium, ruthenium, platinum, osmium, rhenium, and palladium. The metal complexes may also have at least one ligand having a phenylpyridine backbone, bipyridyl backbone, porphyrin backbone, or the like. More specific examples of the red phosphorescent material include tris(1-phenylisoquinoline)iridium, bis(2-benzo[b]thiophen-2-yl-pyridine) (acetylacetonate)iridium(III) (Ir(btp)$_2$(acac)), 2,3,7,8,12,13,17,18-octaethyl-21H,23H-porphine platinum (PtOEP).

The host material is not particularly limited as long as exhibiting the aforementioned function with respect to the red luminescent material that is used, however, when the red luminescent material contains the red fluorescent material, examples of the host material include anthracene derivatives such as that represented by Formula (6) below, acene derivatives (acene-based compounds) such as anthracene derivatives, which is, for example, 3-tert-butyl-9,10-di (naphth-2-yl)anthracene (TBADN) and tetracene derivatives represented by Formula (3) below, distyrylarylene derivatives, perylene derivatives, distyrylbenzene derivatives, distyrylamine derivatives, quinolinolate-based metal complexes such as a tris(8-quinolinolato) aluminum complex (Alq$_3$), triarylamine derivatives such as a tetramer of triphenylamine, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2-diphenylvinyl)biphenyl(DPVBi). These can be used in one type singly or in combination of two types or more.

[Formula 1]

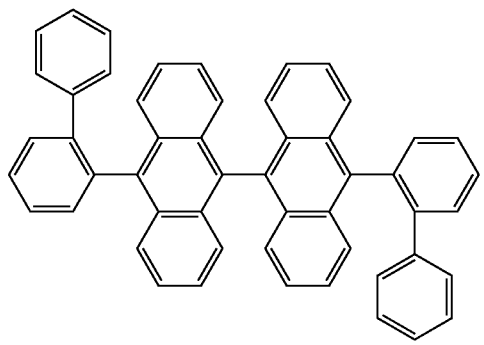

(6)

[Formula 2]

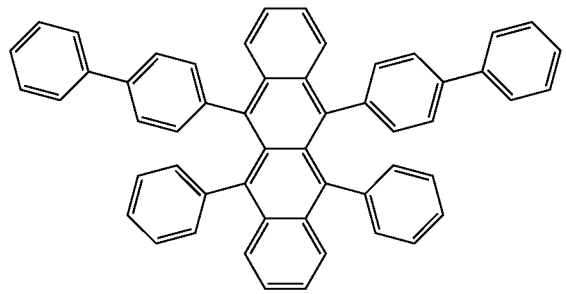

(3)

Further, when the red luminescent material contains the red phosphorescent material, examples of the host material include carbazole derivatives such as 4,4'-bis(carbazol-9-yl)biphenyl (CBP). These can be used in one type singly or in combination of two types or more.

Electron Transport Layer

The electron transport layer functions to transport electrons injected from the second electrode E2 (a cathode) via the electron injection layer, to the light-emitting layer.

Examples of the constituent material of the electron transport layer (an electron transport material) include phenanthroline derivatives such as 2,9-dimethyl-4,7-diphenyl-1,10-phenanthroline (BCP), and quinoline derivatives such as organometallic complexes having 8-quinolinol or its derivative as a ligand, for example, tris(8-hydroxy-quinolinato)aluminium ($Alq_3$)), azaindolizine derivatives, oxadiazole derivatives, perylene derivatives, pyridine derivatives, pyrimidine derivatives, quinoxaline derivatives, diphenylquinone derivatives, and nitro-substituted fluorene derivatives. These can be used in one type or in combination of two types or more.

Electron Injection Layer

The electron injection layer functions to improve electron injection efficiency from the second electrode E2 (a cathode).

Examples of the constituent material of the electron injection layer (an electron injection material) include various types of inorganic insulating materials and various types of inorganic semiconductor materials.

Examples of such an inorganic insulating material include alkali metal chalcogenides (oxides, sulfides, selenides, tellurides), alkaline earth metal chalcogenides, and alkali metal halides and alkaline earth metal halides. These can be used in one type or in combination of two types or more. Configuring the electron injection layer with the above as the main material makes it possible to further improve the electron injection properties. In particular, alkali metal compounds (alkali metal chalcogenides, alkali metal halides, and the like) have an extremely small work function, and by using these to configure the electron injection layer, the light-emitting element achieves high luminance.

Examples of the alkali metal chalcogenides include $Li_2O$, LiO, $Na_2S$, $Na_2Se$, and NaO.

Examples of the alkaline earth metal chalcogenides include CaO, BaO, SrO, BeO, BaS, MgO, and CaSe.

Examples of the alkali metal halides include CsF, LiF, NaF, KF, LiCl, KCl, and NaCl.

Examples of the alkaline earth metal halides include $CaF_2$, $BaF_2$, $SrF_2$, $MgF_2$, and $BeF_2$.

Further, examples of the inorganic semiconductor materials include oxides, nitrides, or oxynitrides including at least one element from among Li, Na, Ba, Ca, Sr, Yb, Al, Ga, In, Cd, Mg, Si, Ta, Sb, and Zn. These can be used in one type or in combination of two types or more.

Configurations of Second Panel 20 and Third Panel 30

Figure 9:
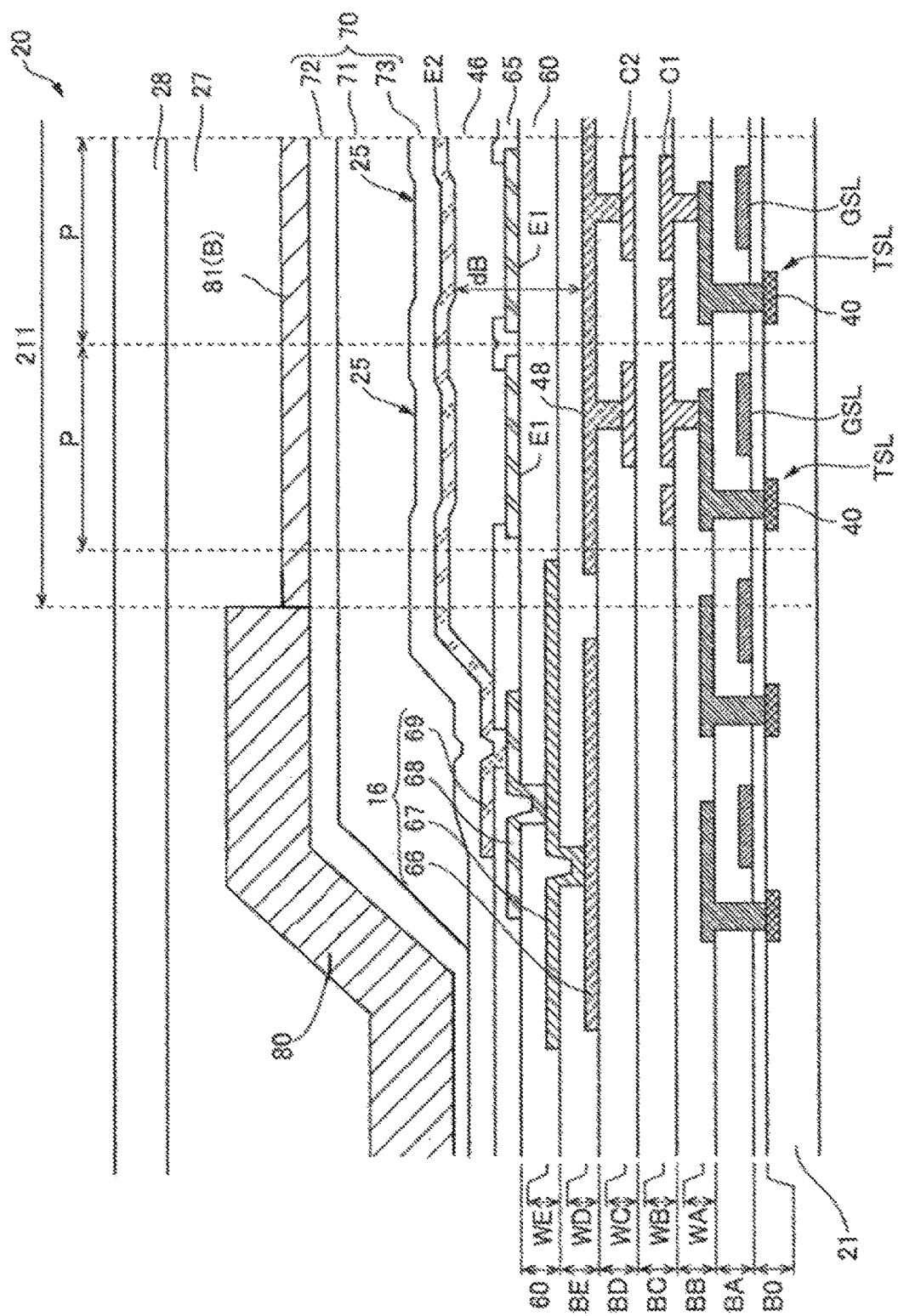
FIG. 9 is a cross-sectional view of a second panel illustrated in FIG. 1.
Figure 10:
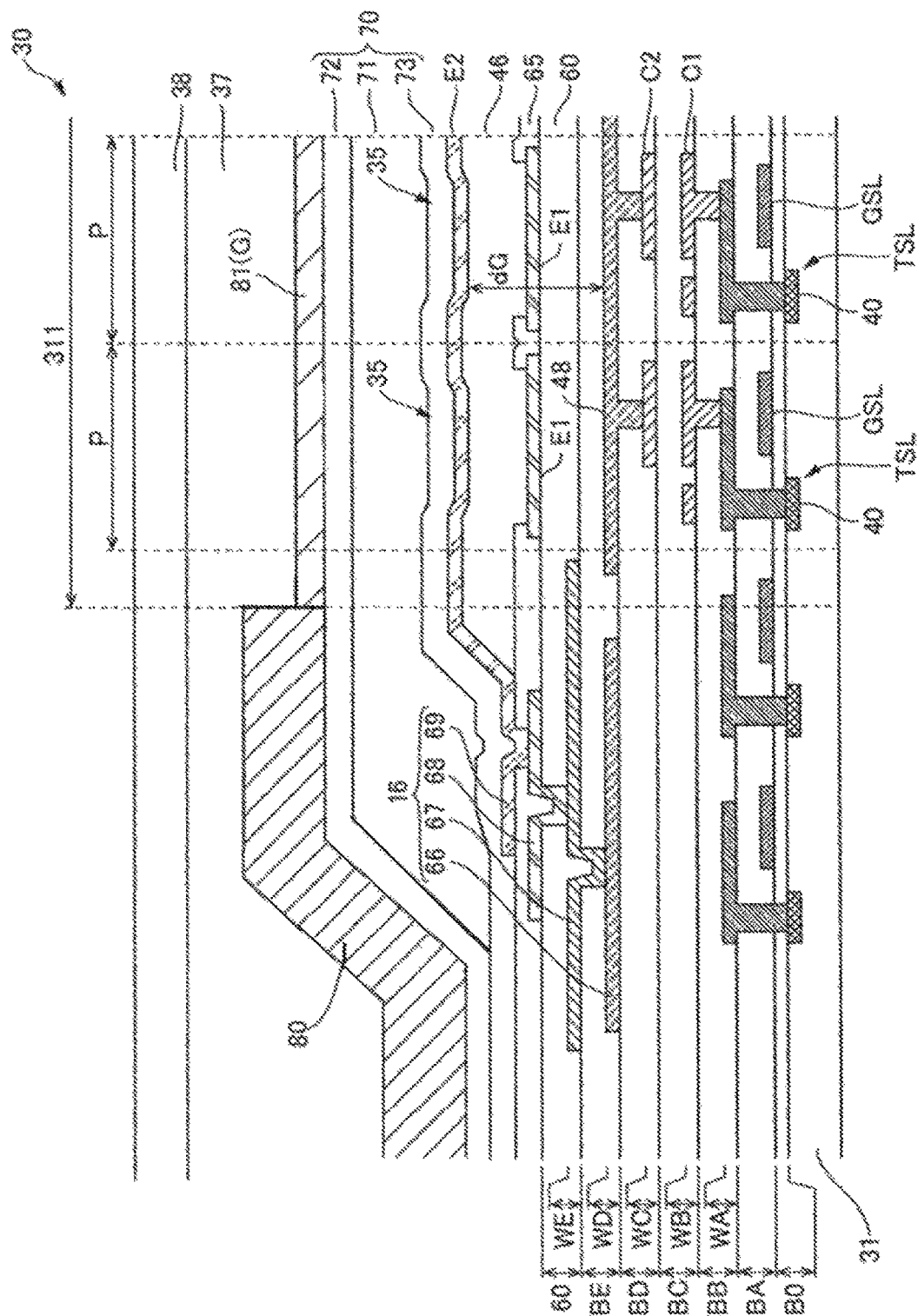
FIG. 10 is a cross-sectional view of a third panel illustrated in FIG. 1.

FIG. 9 is a cross-sectional view of the second panel 20 illustrated in FIG. 1. FIG. 10 is a cross-sectional view of the third panel 30 illustrated in FIG. 1. Note that, for easy understanding of the description, descriptions will be given below assuming that in FIGS. 9 and 10, the upper side is "upper" and the lower side is "lower".

The second panel 20 and the third panel 30 illustrated in FIG. 1 have the electrical configuration illustrated in FIGS. 6 and 7 as in the first panel 10. As illustrated in FIGS. 9 and 10, the second panel 20 and the third panel 30 include, in place of the plurality of first light-emitting element 15, the plurality of second light-emitting elements 25 that emit blue image light by including the light-emitting functional layer 46, that is, a second functional layer constituted by an organic layer including a light-emitting layer (a blue light-emitting layer) formed containing an organic EL material that emits blue color light, and the plurality of third light-emitting elements 35 that emit green image light by including the light-emitting functional layer 46, that is, a third functional layer constituted by an organic layer including a light-emitting layer (a green light-emitting layer) formed containing an organic EL material that emits green color light, respectively.

Note that the light-emitting layer (a blue light-emitting layer) included in the light-emitting functional layer 46 that is included in the second light-emitting element 25 and the light-emitting layer (a green light-emitting layer) included in the light-emitting functional layer 46 that is included in the third light-emitting element 35 are each configured as described below, for example.

Blue Light-Emitting Layer

The blue light-emitting layer is configured to include a blue luminescent material that emits blue color light, and a host material that holds the blue luminescent material.

Such a blue luminescent material is not particularly limited, and for the blue luminescent material, various blue fluorescent materials and blue phosphorescent materials can be used in one type or in combination of two types or more.

Examples of the blue fluorescent material include, without being particularly limited as long as being a material that emits blue fluorescent light, distyrylamine derivatives such as distyryldiamine compounds, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl(BCzVBi), poly[{9,9-dioctylfluorenyl-2,7-diyl}-co-{1,4-(2,5-dimethoxy)benzene}], poly[{9,9-dihexyloxyfluorene-2,7-diyl}-ortho-co-(2-methoxy-5-{2-ethoxyhexyloxy}phenylene-1,4-diyl], poly[{9,9-dioctylfluorenyl-2,7-diyl}-co-{ethynylbenzene}]. These can be used in one type singly or in combination of two types or more.

Examples of the blue phosphorescent material include, without being particularly limited as long as being a material that emits blue phosphorescent light, metal complexes such as iridium, ruthenium, platinum, osmium, rhenium, and palladium. More specific examples of the blue phosphorescent material include bis[2-(4,6-difluorophenyl)pyridinato-N,C2'](picolinate)iridium(III) (Firpic), tris[2-(4,6-difluorophenyl)pyridinato-N,C2')]iridium(III) (Ir(Fppy)$_3$), bis[2-(3,5-trifluoromethyl)pyridinato-N,C2'](picolinate)iridium(III), bis[2-(4,6-difluorophenyl)pyridinato-N,C2'](acetylacetonate)iridium(III).

As the host material, a host material being the same as that described as the host material of the red light-emitting layer can be used, and among these, acene-based compounds are favorably used.

Green Light-Emitting Layer

The green light-emitting layer is configured to include a green luminescent material that emits green color light, and a host material (a third host material) that holds the green luminescent material.

Such a green luminescent material is not particularly limited, and for the green luminescent material, various green fluorescent materials and green phosphorescent materials can be used in one type or in combination of two types or more.

Examples of the green fluorescent material include, without being particularly limited as long as being a material that emits green fluorescent light, coumarin derivatives, quinacridone and its derivatives such as quinacridone derivatives, 9,10-bisi[9-ethyl-3-carbazoyl)-vinylenyl)]-anthracene, poly(9,9-dihexyl-2,7-vinylenefluorene), poly[(9,9-dioctylfluorene-2,7-diyl)-co-(1,4-diphenylene-vinylene-2-methoxy-5-(2-ethylhexyloxy)benzen)], poly[(9,9-dioctyl-2,7-divinylenefluorene)-oltho-co-(2-methoxy-5-(2-ethoxyloxy-1,4-phenylene)]. These can be used in one type singly or in combination of two types or more.

Examples of the green phosphorescent material include, without being particularly limited as long as being a material that emits green phosphorescent light, metal complexes such as iridium, ruthenium, platinum, osmium, rhenium, and palladium. Among those, the metal complexes having at least one ligand having a phenylpyridine backbone, bipyridyl backbone, porphyrin backbone, or the like are favorably used. More specific examples of the green phosphorescent material include tris(2-phenylpyridinato)iridium (III) (Ir(ppy)$_3$), bis(2-phenylpyridine) (acetylacetonate)iridium(III) (Ir(ppy)$_2$(acac)), tris{5-fluoro-2-[5-(trifluoromethyl)-2-pyridinyl]phenyl}iridium.

As the host material, a host material being the same as that described as the host material of the red light-emitting layer can be used, and among these, acene-based compounds are favorably used.

Further, as illustrated in FIG. 9, in the second panel 20, in place of the first coloring layer 81(R) described with reference to FIG. 8, the second coloring layer 81(B) is formed, where the second coloring layer 81(B) selectively allows the blue color light in the second wavelength region to pass through the second coloring layer 81(B). Further, among the layers, which are illustrated in FIG. 9, of the first power supply conductor 48 as a reflective film, the insulating layer BE, the optical adjustment layer 60, the first electrode E1 being a transparent electrode, the light-emitting functional layer 46 including a light-emitting layer, and the second electrode E2 being a semireflective semitransmissive electrode, the light-emitting functional layer 46, that is, the second functional layer, in particular, is adjusted in film thickness to correspond to the wavelength of the second image light LB of blue color emitted from the second panel 20, to thus optimize, in the optical resonator, an optical path length dB (an optical distance) between the first power supply conductor 48 that functions as a reflective film and the second electrode E2 that functions as a semireflective semitransmissive electrode. Further, in the second panel 20, a cover substrate 28 having light-transmissivity is fixed, with an adhesive 27, to the second coloring layer 81(B), on the opposite side of the second substrate 21.

Moreover, as illustrated in FIG. 10, in the third panel 30, in place of the first coloring layer 81(R) described with reference to FIG. 8, the third coloring layer 81(G) is formed, where the third coloring layer 81(G) selectively allows the green color light in the third wavelength region to pass through the third coloring layer 81(G). Further, among the layers, which are illustrated in FIG. 10, of the first power supply conductor 48 as a reflective film, the insulating layer BE, the optical adjustment layer 60, the first electrode E1 being a transparent electrode, the light-emitting functional layer 46 including a light-emitting layer, and the second electrode E2 being a semireflective semitransmissive electrode, the light-emitting functional layer 46, that is, the third functional layer, in particular, is adjusted in film thickness to correspond to the wavelength of the third image light LG of green color emitted from the third panel 30, to thus optimize, in the optical resonator, an optical path length dG (an optical distance) between the first power supply conductor 48 that functions as a reflective film and the second electrode E2 that functions as a semireflective semitransmissive electrode. In addition, in the third panel 30, a cover substrate 38 having light-transmissivity is fixed, with an adhesive 37, to the third coloring layer 81(G), on the opposite side of the third substrate 31.

Note that in the first embodiment, in the second panel 20 and the third panel 30, the first power supply conductor 48 being a reflective film, the insulating layer BE, the optical adjustment layer 60, and the first electrode E1 being a transparent electrode, among the layers that configure the optical resonator, constitute the second substrate portion and the third substrate portion, respectively.

Further, in the first panel 10, the second panel 20, and the third panel 30, the lengths of the optical path length dR, the optical path length dB, and the optical path length dG are optimized, respectively, and as described above, the first panel 10 emits the first image light LR of red color light having a long wavelength, the second panel 20 emits the second image light LB of blue color light having a wavelength less than the wavelength of the first image light LR, and the third panel 30 emits the third image light LG of green color light having a wavelength of medium wavelength between the first image light LR and the second image light LB. Accordingly, in the first panel 10, the second panel 20, and the third panel 30, the lengths of the optical path length dR, the optical path length dB, and the optical path length dG are optimized by being adjusted in the order of the optical path length dR> the optical path length dG> the optical path length dB.

Incidentally, in the image display device 1 configured as described above, in the first panel 10, the light-emitting functional layer 46, that is, the first functional layer included in the plurality of first light-emitting elements 15 is adjusted in film thickness to correspond to the wavelength of the first image light LR of red color. Further, in the second panel 20, the light-emitting functional layer 46, that is, the second functional layer included in the plurality of second light-emitting elements 25 is adjusted in film thickness to correspond to the wavelength of the second image light LB of blue color. Moreover, in the third panel 30, the light-emitting functional layer 46, that is, the third functional layer included in the plurality of third light-emitting elements 35 is adjusted in film thickness to correspond to the wavelength of the third image light LG of green color. As such, the wavelength regions of the image light to be emitted from the plurality of first light-emitting elements 15, the plurality of second light-emitting elements 25, and the plurality of third light-emitting elements 35 differ from one another. Accordingly, the light-emitting functional layers 46 in the plurality of first light-emitting elements 15, the plurality of second light-emitting elements 25, and the plurality of third light-emitting elements 35 each have a different film thickness. In other words, the light-emitting functional layer 46, that is, the first functional layer in the plurality of first light-emitting elements 15, the light-emitting functional layer 46, that is, the second light-emitting functional layer in the plurality of second light-emitting elements 25, and the light-emitting functional layer 46, that is, the third functional layer in the plurality of third light-emitting elements 35 each have a different film thickness.

As such, the light-emitting functional layer 46 in the plurality of first light-emitting elements 15, the plurality of second light-emitting elements 25, and the plurality of third light-emitting elements 35 are appropriately set in size of film thickness in accordance with the respective light-emitting elements 15, 25, and 35. This allows, in the optical resonator of the plurality of first light-emitting elements 15, the optical path length dR (an optical distance) between the first power supply conductor 48 and the second electrode E2 to be optimized, thus causing the first image light LR of red color having a peak in the first color region to be emitted in a reliable manner. Further, this allows, in the optical resonator of the plurality of second light-emitting elements 25, the optical path length dB (an optical distance) between the first power supply conductor 48 and the second electrode E2 to be optimized, thus causing the second image light LB of blue color having a peak in the second color region to be emitted in a reliable manner. Moreover, this allows, in the optical resonator of the plurality of third light-emitting elements 35, the optical path length dG (an optical distance) between the first power supply conductor 48 and the second electrode E2 to be optimized, thus causing the third image light LG of green color having a peak in the third color region to be emitted in a reliable manner. That is, the light-emitting functional layers 46 in the plurality of first light-emitting elements 15, the plurality of second light-emitting elements 25, and the plurality of third light-emitting elements 35 are appropriately set in size of film thickness, to thus set the optical path length dR, the optical path length dB, and the optical path length dG between the first power supply conductor 48 and the second electrode E2 to a desired distance.

Further, as described above, the light-emitting functional layers 46, that is, the first functional layer, the second functional layer, and the third functional layer, are adjusted in film thickness to appropriately set the optical path lengths dR, dB, and dG between the first power supply conductor 48 and the second electrode E2 in the optical resonator. Accordingly, this allows, in the first panel 10, the second panel 20, and the third panel 30, the configurations in thickness direction, that is, the layer configurations of the first substrate portion, the second substrate portion, and the third substrate portion included in the first light-emitting element 15, the second light-emitting element 25, and the third light-emitting element 35, which are included in the first panel 10, the second panel 20, and the third panel 30, respectively, to be set as identical.

In other words, the first substrate portion, the second substrate portion, and the third substrate portion are each constituted, as described above, by the layers of the first power supply conductor 48 being a reflective film, the insulating layer BE, the optical adjustment layer 60, and the first electrode E1 being a transparent electrode, and the layers can have an identical film thickness in the first substrate portion, the second substrate portion, and the third substrate portion. That is, in the first substrate portion, the second substrate portion, and the third substrate portion, the first power supply conductors 48 being a reflective film can have an identical film thickness, the insulating layers BE can have an identical film thickness, the optical adjustment layers 60 can have an identical film thickness, and the first electrodes E1 being a transparent electrode can have an identical film thickness.

Here, the panels 10, 20, and 30 configured as described above are typically formed in such a way that a support substrate constituted by the first substrate 11, the insulating film BO, the gate electrode GSL, the insulating layers BA to BD, and the wiring layers WA to WC is formed, and on the support substrate, steps are conducted in which the first power supply conductors 48, the insulating layers BE, the optical adjustment layers 60, and the first electrodes E1, the light-emitting functional layers 46, the second electrodes E2, the sealing bodies 70, the coloring layers 81, the adhesives 17, 27, and 37, and the cover substrates 18, 28, and 38 are layered, respectively, in this order.

This allows the configurations in thickness direction of the first substrate portion, the second substrate portion, and the third substrate portion included in the first light-emitting element 15, the second light-emitting element 25, and the third light-emitting element 35 to be set as identical. Thus, the first panel 10, the second panel 20, and the third panel 30 can be formed in identical steps until the formation of the substrate portions on the support substrate, in manufacturing the first panel 10, the second panel 20, and the third panel 30. This simplifies the steps in manufacturing the first panel 10, the second panel 20, and the third panel 30. This results in improvement in yield in manufacturing the panels 10, 20, and 30, preventing a flow management of the support substrate on which the substrate portions are formed from being complexed.

Note that in the first embodiment, having "an identical configuration in thickness direction" of the first substrate portion, the second substrate portion, and the third substrate portion represents that in the first substrate portion, the second substrate portion, and the third substrate portion, the first power supply conductors 48, the insulating layers BE, the optical adjustment layers 60, and the first electrodes E1, which are included in the first substrate portion, the second substrate portion, and the third substrate portion, are set to an identical film thickness for each of these layers. In addition, having "an identical film thickness" shall include an error that occurred when the film formation is conducted through identical steps.

Further, as described above, in the present disclosure, the light-emitting functional layers 46, that is, the first functional layer, the second functional layer, and the third functional layer, are adjusted in film thickness to appropriately set the optical path lengths dR, dB, and dG between the first power supply conductor 48 and the second electrode E2 in the optical resonator. Moreover, the light-emitting functional layer 46 may be constituted by a single layer body composed of the light-emitting layer, or may be constituted by a laminated body provided with a transport layer or an injection layer of electrons or holes supplied to the light-emitting layer, however, in view of setting each of the optical path lengths dR, dB, and dG between the first power supply conductor 48 and the second electrode E2 to an appropriate size, the light-emitting functional layer 46 may be constituted by the laminated body. This allows the optical path lengths dR, dB, and dG to be appropriately set in size without altering the film thickness of the light-emitting layer, thus making it possible to set the film thickness of the light-emitting layer only in view of the light emission efficiency of the light-emitting elements 15, 25, and 35.

Moreover, when the light-emitting functional layer 46 is constituted by the above-described laminated body, the light-emitting functional layer 46 may include a hole transport layer in addition to the light-emitting layer, and the optical path lengths dR, dB, and dG may be appropriately set in size by adjusting the film thickness of the hole transport layer. In other words, the light-emitting functional layers 46 included in the first light-emitting element 15, the second light-emitting element 25, and the third light-emitting element 35, that is, the hole transport layers included in the first functional layer, the second functional layer, and the third functional layer each have a different film thickness in order to set the sizes of the optical path lengths dR, dB, and dG. As such, in the light-emitting elements 15, 25, and 35 of top-emission type that extracts light from the side of the second electrode E2, the hole transport layer located on the opposite side of the light-emitting layer from the second electrode E2 is adjusted in film thickness, to thus suppress or prevent an occurrence of interference in the light extracted from the side of the second electrode E2 in an adequate manner.

Further, in the light-emitting functional layers 46 included in the first light-emitting element 15, the second light-emitting element 25, and the third light-emitting element 35, that is, the first functional layer, the second functional layer, and the third functional layer, when the light-emitting functional layer 46 includes, as described above, the electron transport layer as a layer other than the light-emitting layer in addition to the hole transport layer, the film thickness of the hole transport layer may be greater than the sum of the film thickness of the electron transport layer and the film thickness of the light-emitting layer. As such, even when the film thickness of the hole transport layer is thick, the hole transport layer located on the opposite side of the light-emitting layer from the second electrode E2 is adjusted in film thickness, to thus suppress or prevent an occurrence of interference in the light extracted from the side of the second electrode E2 in a more adequate manner.

Note that in the first embodiment, descriptions are given about cases in which in the first panel 10, the second panel 20, and the third panel 30, red color light, blue color light, and green color light emitted from the first light-emitting element 15, the second light-emitting element 25, and the third light-emitting element 35 are caused to pass through, as image light in the respective wavelength regions, the first coloring layer 81(R), the second coloring layer 81(B), and the third coloring layer 81(B), respectively, and the first panel 10, the second panel 20, and the third panel 30 include the optical resonator and the coloring layer, the present disclosure is not limited to such cases, and for example, the first panel 10, the second panel 20, and the third panel 30 may also be a panel in which the formation of the coloring layer is omitted. Further, each of the first light-emitting element 15, the second light-emitting element 25, and the third light-emitting element 35 may also be a light-emitting element that emits white light.

In addition, in the first embodiment, descriptions are given about cases in which the first panel 10, the second panel 20, and the third panel 30 include the cover substrate 18, the cover substrate 28, and the cover substrate 38, respectively, and the first panel 10, the second panel 20, and the third panel 30 may also be panels in which the formations of the cover substrate 18, the cover substrate 28, and the cover substrate 38 are omitted.

Second Embodiment

Next, a second embodiment of the present disclosure will be described below.

Figure 11:
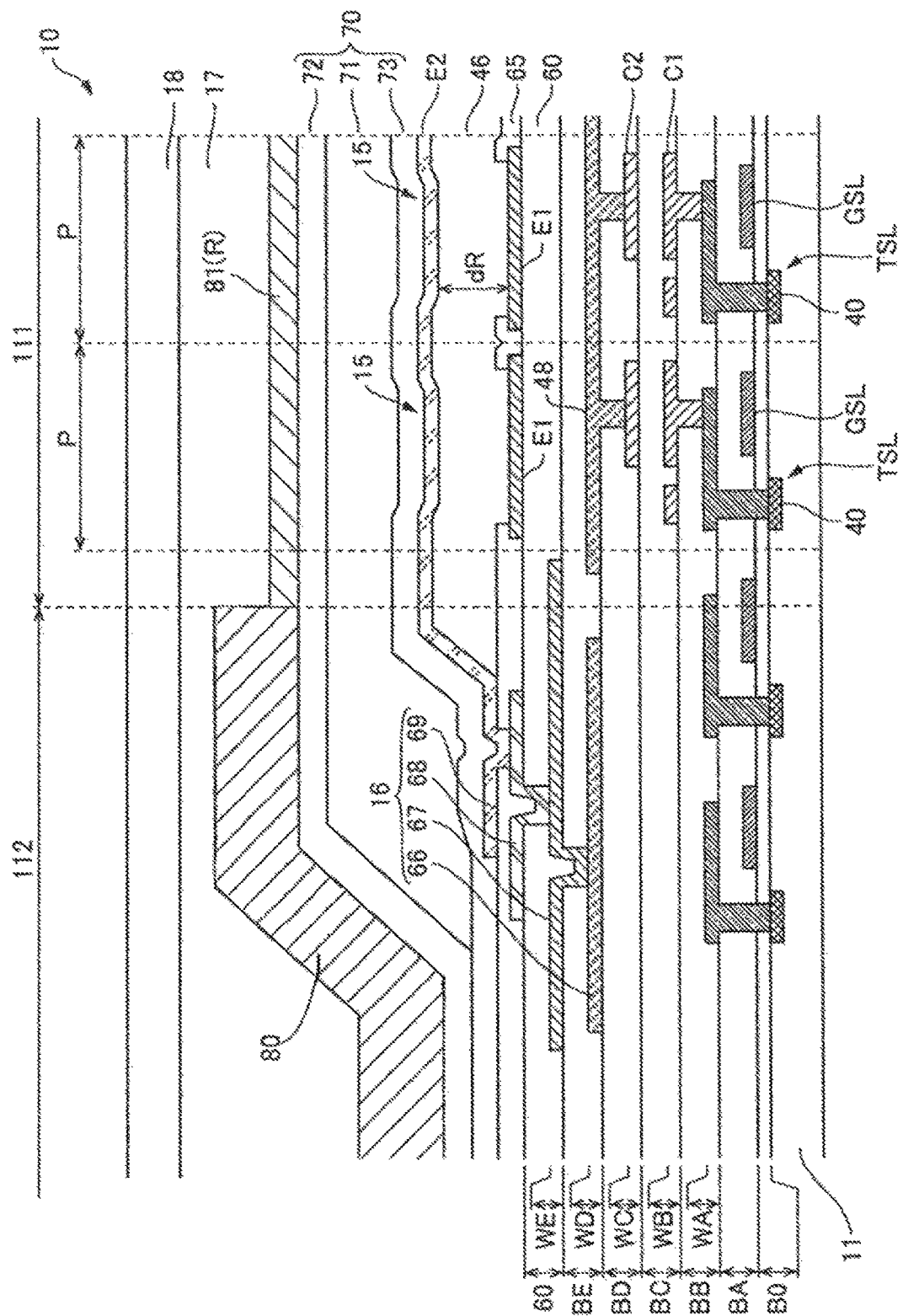
FIG. 11 is a cross-sectional view of a first panel included in an image display device according to a second embodiment of the present disclosure.
Figure 12:
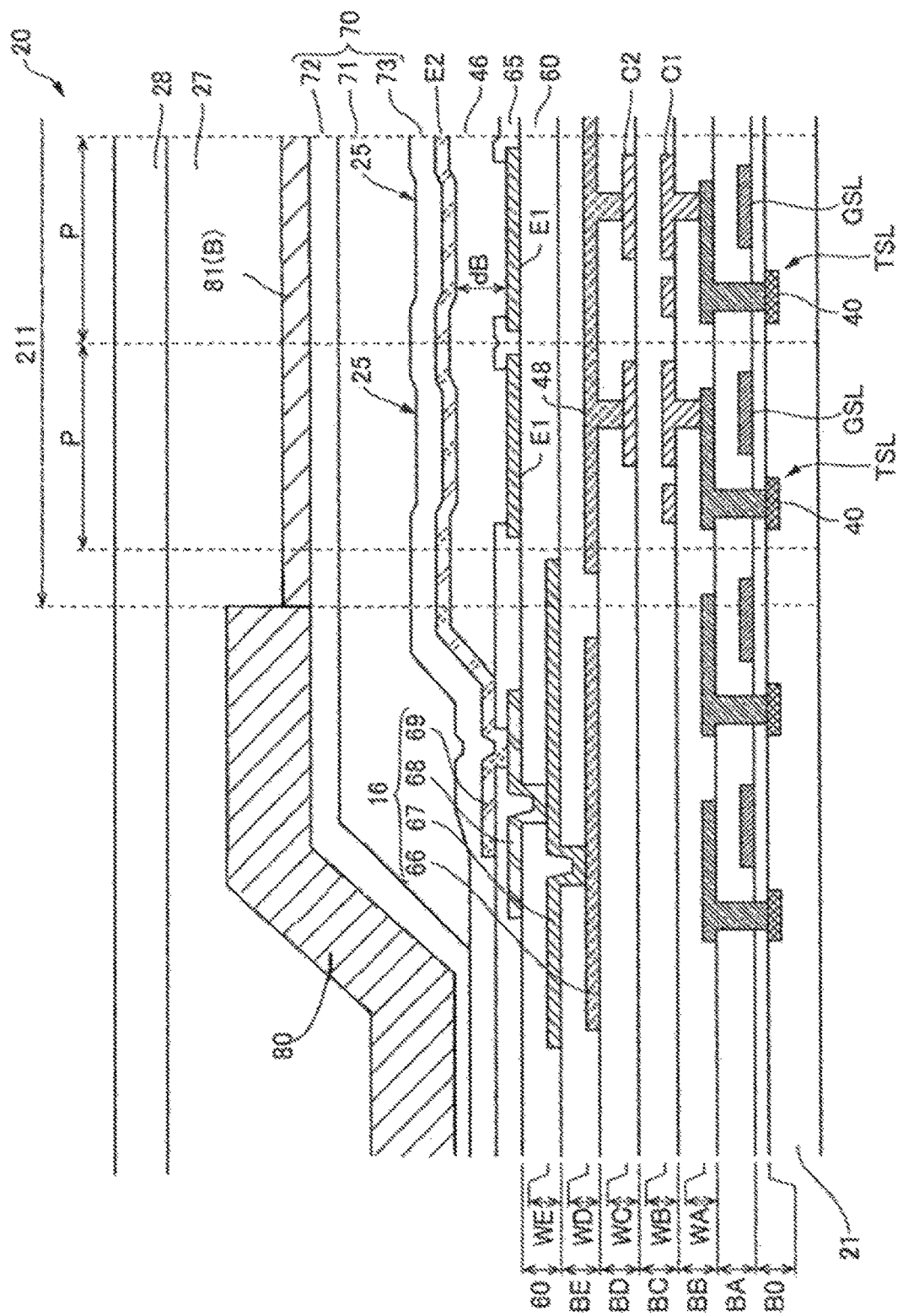
FIG. 12 is a cross-sectional view of a second panel included in an image display device according to a second embodiment of the present disclosure.
Figure 13:
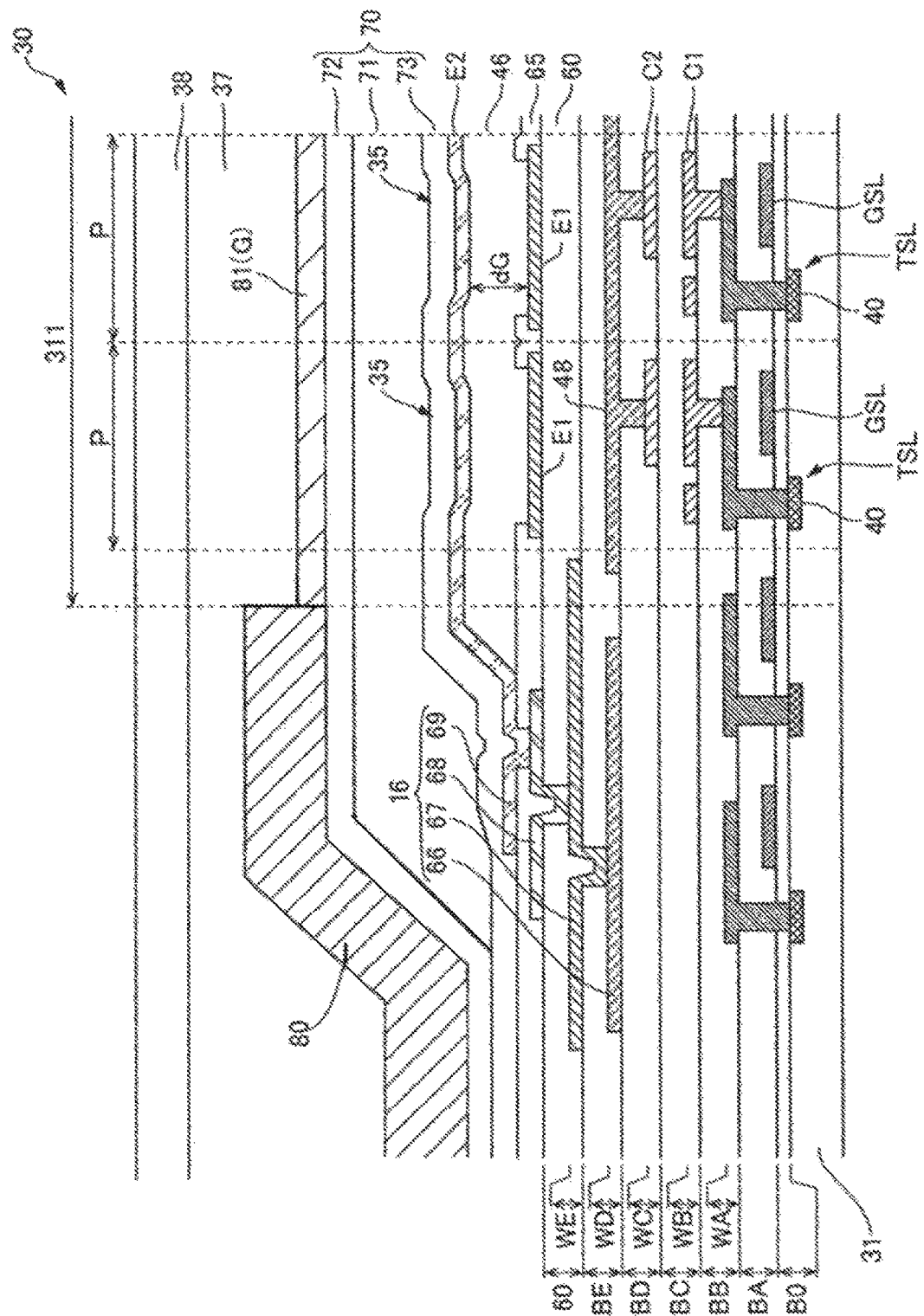
FIG. 13 is a cross-sectional view of a third panel included in an image display device according to a second embodiment of the present disclosure.

FIG. 11 is a cross-sectional view of a first panel included in an image display device according to the second embodiment of the present disclosure. FIG. 12 is a cross-sectional view of a second panel included in an image display device according to the second embodiment of the present disclosure. FIG. 13 is a cross-sectional view of a third panel included in an image display device according to the second embodiment of the present disclosure.

Descriptions will be given below about an image display device 1 according to the second embodiment, focusing on the difference with respect to the image display device 1 according to the first embodiment, where descriptions of similar matters will not be given.

The image display device 1 is identical to the image display device 1 according to the first embodiment, except that in the first panel 10, the second panel 20, and the third panel 30 illustrated in FIGS. 11 to 13, the first electrode E1 is composed of a reflective electrode configured as a reflective film, rather than a transparent electrode.

That is, in the image display device 1 according to the second embodiment, the first electrode E1 is constituted by a reflective electrode having no transparency in the first panel 10, the second panel 20, and the third panel 30. This allows, in the second embodiment, in place of the first power supply conductor 48, the first electrode E1 to function as a reflective film. Accordingly, as illustrated in FIGS. 11 to 13, the optical resonator is configured by the layers of the first electrode E1, the light-emitting functional layer 46 including a light-emitting layer, and the second electrode E2, and the optical path lengths dR, dB, and dG are set by the distance between the first electrode E1 that functions as a reflective film and the second electrode E2 that functions as a semi-reflective semitransmissive electrode.

Note that, when the reflective film is constituted by the first electrode E1 as in the second embodiment, the first power supply conductor 48, the insulating layer BE, and the optical adjustment layer 60 located on the lower side of the first electrode E1, that is, on the opposite side of the second electrode E2 may be omitted or replaced with other layers within a range in which the functions of the first panel 10, the second panel 20, and the third panel 30 are maintained. Further, when the first power supply conductor 48, the insulating layer BE, and the optical adjustment layer 60 are omitted, in the first panel 10, the second panel 20, and the third panel 30, the first electrodes E1 being a reflective film, among the layers that configure the optical resonator, constitute the first substrate portion, the second substrate portion, and the third substrate portion, respectively.

Further, the first electrode E1 being a reflective film may be composed of constituent materials such as Au, Pt, Ag, Cu, and alloys or the like containing these metals, for example.

Moreover, when the first electrode E1 is composed of the reflective film as in the second embodiment, the first electrode E1 is composed of the above-described constituent materials. Thus, the light-emitting functional layers 46, that is, the first functional layer, the second functional layer, and the third functional layer included in the first light-emitting element 15, the second light-emitting element 25 and the third light-emitting element 35 may include a hole transport layer in addition to the light-emitting layer, where the hole transport layer is constituted by a laminated body including two or more layers. As such, the hole transport layer is constituted by a laminated body including two or more layers, to thus expand the range of selections in designing the layer configuration of the hole transport layer in view of the injection efficiency of the holes from the first electrode E1 to the hole transport layer and the transport efficiency of the holes within the hole transport layer.

Specifically, the hole transport layer may be constituted by a laminated body including a mixed layer, being in contact with the first electrode E1, containing a hole transport material and a hole injection material, and a single layer, being in contact with the light-emitting layer, containing a hole transport material. This allows the hole transport layer to be provided with both excellent injection characteristics of the holes from the first electrode E1 to the hole transport layer and excellent transport characteristics of the holes within the hole transport layer. Note that, when the hole transport layer is constituted by a laminated body of a mixed layer and a single layer, the mixed layer may be referred to as hole injection layer and the single layer as hole transport layer.

Further, examples of the hole transport material in the laminated body include triphenylamine derivatives, and among these, a starburst type triphenylamine derivative is favorably used.

Moreover, the hole injection material may include, for example, conductive materials such as Au, Pt, Ag, Cu, and alloys or the like containing these metals, or an organic material including an electron-withdrawing substituent such as a cyano group, fluoro group, fluoromethane group, or the like, which is, for example, hexacyanohexaazatriphenylene represented by Formula (8) below.

[Formula 3]

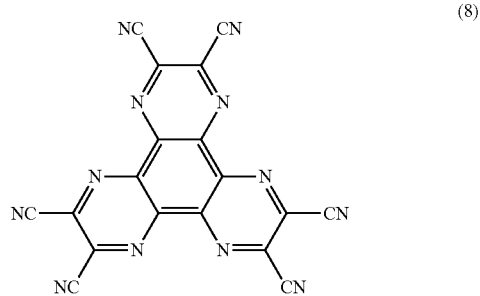

(8)

The image display device 1 according to the second embodiment thus configured can also provide the same benefit as in the first embodiment.

The image display device 1 configured as described above can be incorporated into various virtual image display apparatuses.

Eyeglass Display

Hereinafter, an eyeglass display including the image display device 1 will be described below as an example of the virtual image display apparatus of the present disclosure.

Figure 14:
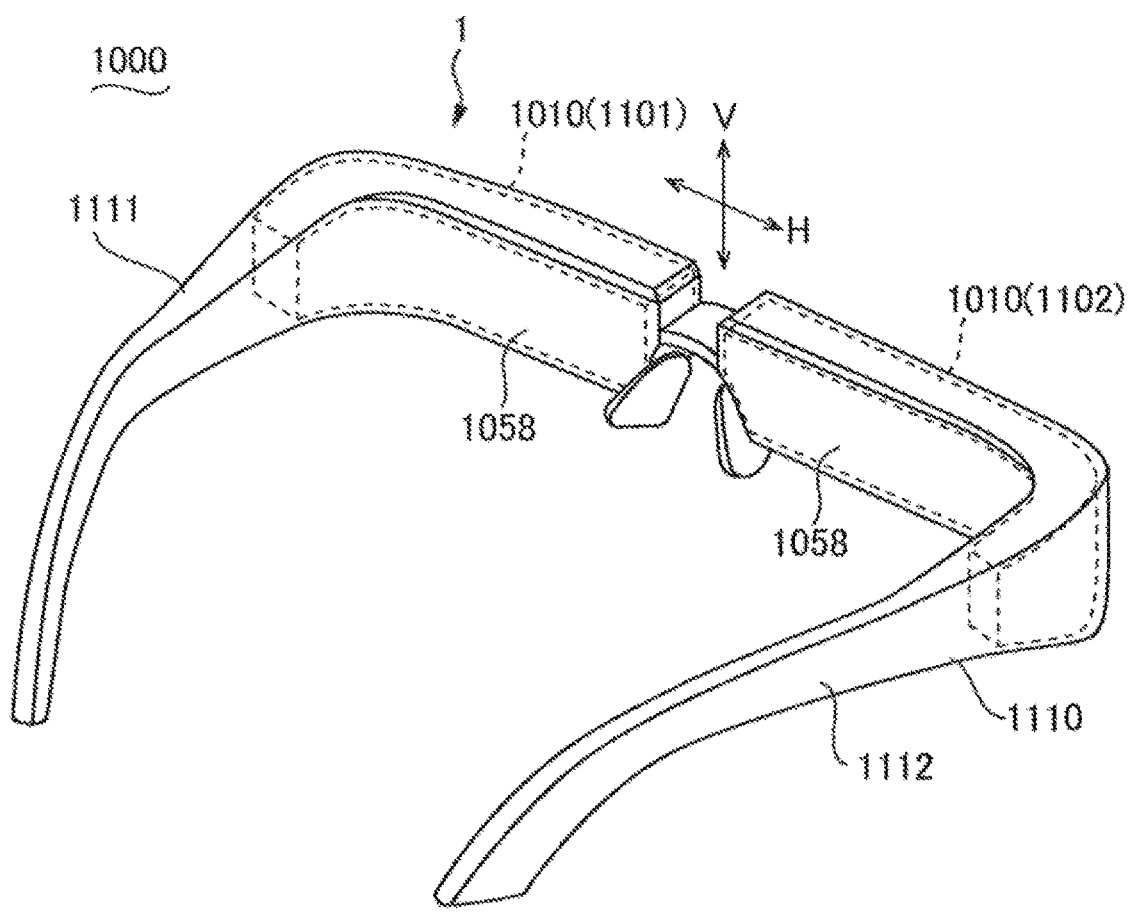
FIG. 14 is an explanatory view of a virtual image display apparatus of a head-mounted type.
Figure 15:
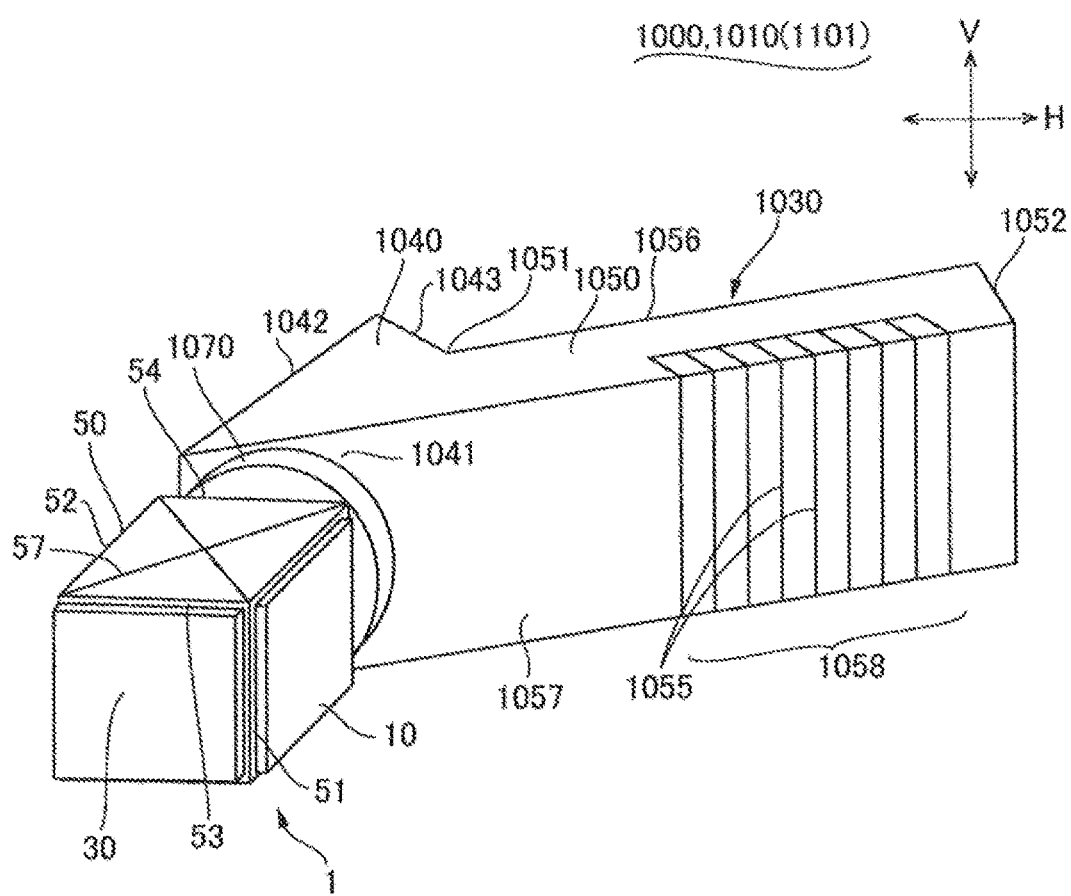
FIG. 15 is a perspective view schematically illustrating a configuration of an optical system of a virtual display unit illustrated in FIG. 14.
Figure 16:
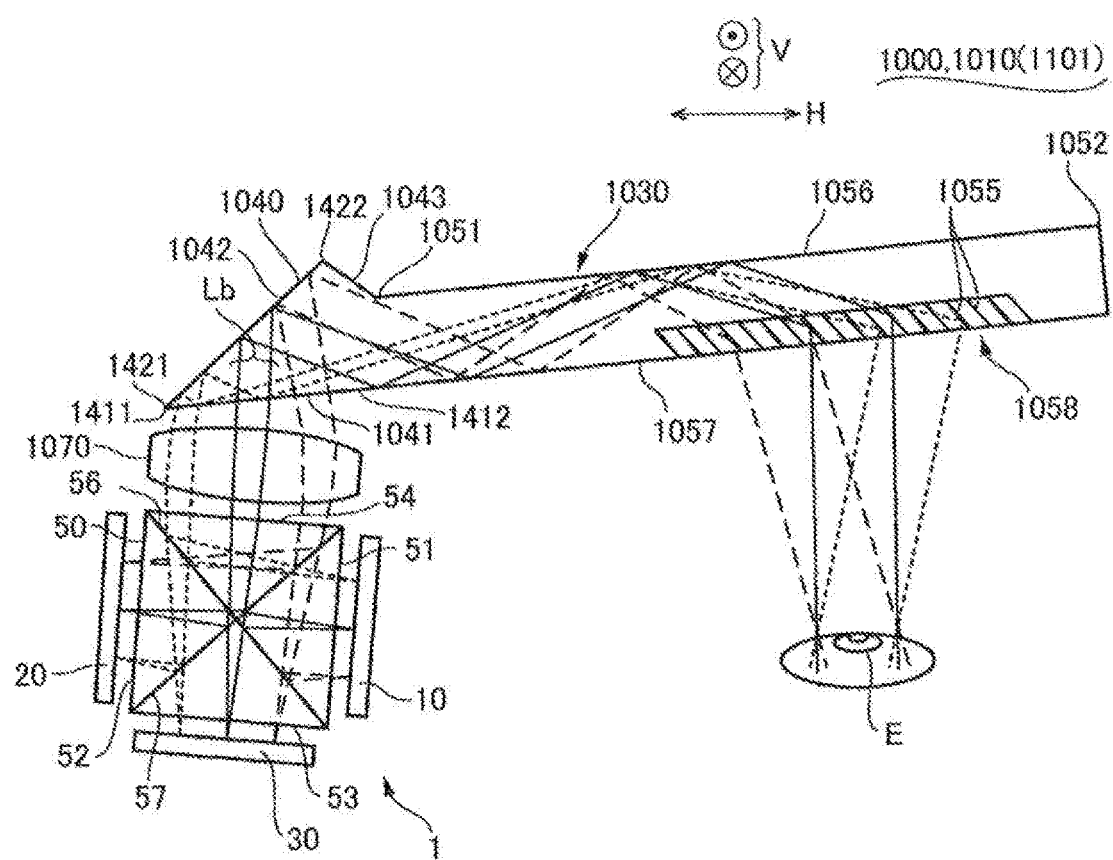
FIG. 16 is an explanatory view illustrating optical paths in an optical system illustrated in FIG. 15.

FIG. 14 is an explanatory view of a virtual image display apparatus of a head-mounted type. FIG. 15 is a perspective view schematically illustrating a configuration of an optical system of virtual display unit 1010 illustrated in FIG. 14. FIG. 16 is an explanatory view illustrating optical paths of the optical system illustrated in FIG. 15.

As illustrated in FIG. 14, a virtual image display apparatus 1000 is configured as an eyeglass display of a see-through type, that is, a head-mounted display of an augmented reality (AR) type, and includes a frame 1110 provided with temples 1111 and 1112 at right and left portions.

The virtual image display apparatus 1000, in which the virtual display units 1010 are supported by the frame 1110, allows the user to recognize an image emitted from the virtual display units 1010 as a virtual image.

In the second embodiment, the virtual image display apparatus 1000 includes a left-eye display unit 1101 and a right-eye display unit 1102 as the virtual display units 1010. The left-eye display unit 1101 and the right-eye display unit 1102, which have an identical configuration, are disposed right-left symmetrically.

The left-eye display unit 1101 will be mainly described below, and descriptions of the right-eye display unit 1102 will not be given.

As illustrated in FIG. 15, in the virtual image display apparatus 1000, the display unit 1101 includes the image display device 1, and a light guiding system 1030 that guides synthesized light Lb emitted from the image display device 1 to an emission portion 1058. A projection lens system 1070 is disposed between the image display device 1 and the light guiding system 1030, and the synthesized light Lb emitted from the image display device 1 is incident on the light guiding system 1030 via the projection lens system 1070. The projection lens system 1070 is configured by a single collimate lens having a positive power.

The light guiding system 1030 includes an incident portion 1040 having light-transmissivity on which the synthesized light Lb is incident, and a light guide portion 1050 having light-transmissivity, one end 1051 side of which is coupled to the incident portion 1040. In the second embodiment, the incident portion 1040 and the light guide portion 1050 are configured as an integrated transmissive member.

The incident portion 1040 includes an incident surface 1041 on which the synthesized light Lb emitted from the image display device 1 is incident, and a reflection surface 1042 that reflects the synthesized light Lb being incident from the incident surface 1041, the synthesized light Lb being reflected between the reflection surface 1042 and the incident surface 1041.

As illustrated in FIG. 16, the incident surface 1041, which is a flat surface, an aspherical surface, a free form surface, or the like, faces the image display device 1 via the projection lens system 1070. The projection lens system 1070 is disposed obliquely such that the spacing between the projection lens system 1070 and an end portion 1412 of the incident surface 1041 is larger than the spacing between the projection lens system 1070 and an end portion 1411 of the incident surface 1041. A reflection film or the like is not formed at the incident surface 1041, and the incident surface 1041 fully reflects light being incident at an incident angle not less than a critical angle. Accordingly, the incident surface 1041 has a light-transmissive property and a light reflecting property.

The reflection surface 1042, which is a surface facing the incident surface 1041, and is disposed obliquely such that an end portion 1422 of the reflection surface 1042 is spaced apart farther from the incident surface 1041 than from an end portion 1421 of the incident surface 1041. Accordingly, the incident portion 1040 has a substantially triangular shape. The reflection surface 1042 is a flat surface, an aspherical surface, a free form surface, or the like. The reflection surface 1042 can employ a configuration in which a reflective metal layer, mainly formed of aluminum, silver, magnesium, chrome or the like, is formed.

The light guide portion 1050 includes a first surface 1056 (a first reflection surface) extending from one end 1051 to other end 1052 side, a second surface 1057 (a second reflection surface) facing and extends in parallel to the first surface 1056 from the one end 1051 side to the other end 1052 side, and the emission portion 1058 provided at a portion of the second surface 1057, which is spaced apart from the incident portion 1040.

The first surface 1056, and the reflection surface 1042 of the incident portion 1040 are joined together via an inclined surface 1043. The film thicknesses of the first surface 1056 and the second surface 1057 are thinner than the incident portion 1040. The first surface 1056 and the second surface 1057 reflect all the light being incident at an incident angle not less than the critical angle, based on a refractive index difference between the light guide portion 1050 and the outside (the air). Accordingly, a reflection film or the like is not formed at the first surface 1056 and the second surface 1057.

The emission portion 1058 is configured as a part of the light guide portion 1050 on the second surface 1057 side in thickness direction of the light guide portion 1050. In the emission portion 1058, a plurality of partial reflection surfaces 1055 that are inclined obliquely with respect to a normal line with respect to the second surface 1057 are arranged in parallel to each other. The emission portion 1058 is a portion, which overlaps with the plurality of partial reflection surfaces 1055, of the second surface 1057, and is a region having a predetermined width in a direction in which the light guide portion 1050 extends. Each of the plurality of partial reflection surfaces 1055 is composed of a dielectric multilayer film. Further, at least one of the plurality of partial reflection surfaces 1055 may be a composite layer of a dielectric multilayer film and a reflective metal layer (a thin film) mainly formed of aluminum, silver, magnesium, chrome, or the like. When the partial reflection surface 1055 is configured to include a metal layer, an effect can be obtained to improve the reflectance of the partial reflection surface 1055, or an effect can be obtained that the incident angle dependence and the polarization dependence of the transmittance and the reflectance of the partial reflection surface 1055 are optimized. Note that the emission portion 1058 may be an aspect in which an optical element, such as a diffraction grating, a hologram, or the like is provided.

In the virtual image display apparatus 1000 thus configured, the synthesized light Lb composed of the parallel light incident from the incident portion 1040, is refracted by the incident surface 1041 to advance toward the reflection surface 1042. Next, the synthesized light Lb is reflected by the reflection surface 1042 to advance toward the incident surface 1041 again. The synthesized light Lb is then incident on the incident surface 1041 at the incident angle not less than the critical angle, and the synthesized light Lb is reflected by the incident surface 1041 toward the light guide portion 1050 to advance toward the light guide portion 1050.

Note that the incident portion 1040 has a configuration in which the synthesized light Lb being parallel light is incident on the incident surface 1041, and a configuration may also be employed in which the incident surface 1041 and the reflection surface 1042 are formed of a free form curve or the like, and the synthesized light Lb being non-parallel light is incident on the incident surface 1041, then, the synthesized light Lb is converted into parallel light while being reflected between the reflection surface 1042 and the incident surface 1041.

In the light guide portion 1050, the synthesized light Lb is reflected between the first surface 1056 and the second surface 1057, and proceeds forward. Then, a part of the synthesized light Lb being incident on the partial reflection surface 1055 is reflected by the partial reflection surface 1055 to be emitted from the emission portion 1058 toward an eye E of the observer. Further, the rest of the synthesized light Lb incident on the partial reflection surface 1055 passes through the partial reflection surface 1055 to be incident on the next, adjacent, partial reflection surface 1055. This allows the synthesized light Lb being reflected by each of the plurality of partial reflection surfaces 1055 to be emitted from the emission portion 1058 toward the eye E of the observer. This makes the observer to recognize a virtual image. Then, the light from the outside, which entered the light guide portion 1050 from the outside, passes through the partial reflection surfaces 1055 to reach the eye E of the observer. This enables the observer to see a color image emitted from the image display device 1, as well as to see the scenery of the outside world or the like in a see-through manner.

Projector

Next, as an example of the virtual image display apparatus of the present disclosure, a projector including the image display device 1 will be described below.

Figure 17:
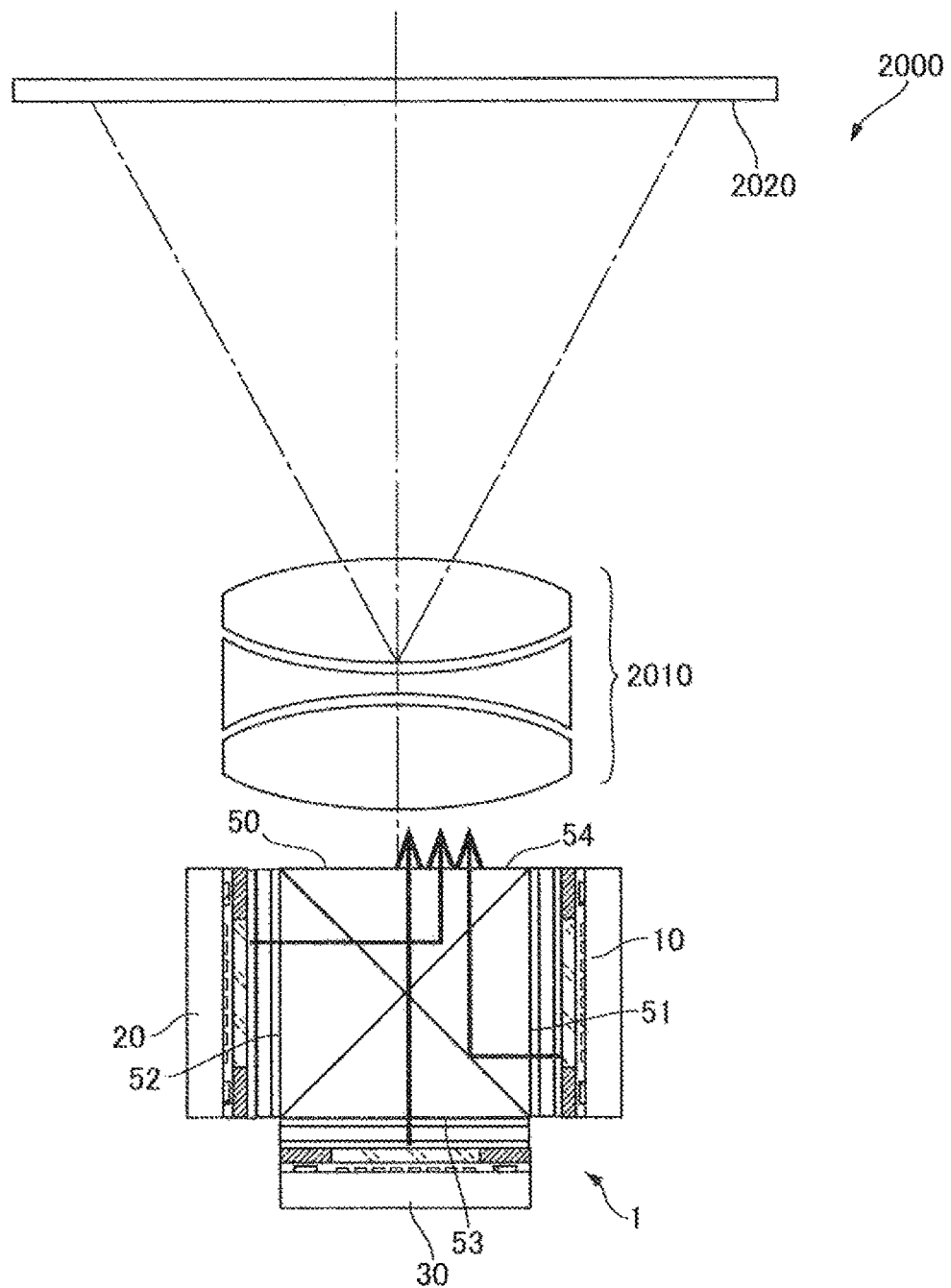
FIG. 17 is an explanatory view of a virtual image display apparatus of a projection type.

FIG. 17 is an explanatory view of a virtual image display apparatus of a projection type.

As illustrated in FIG. 17, a virtual image display apparatus 2000 is a projector including the image display device 1, and a projection optical system 2010 that enlarges and projects the synthesized light Lb emitted from the image display device 1 onto a projected member 2020 such as a screen, or the like.

According to the virtual image display apparatus 2000, an image formed in the image display device 1 is displayed as being magnified in the projected member 2020.

Note that the virtual image display apparatus of the present disclosure can also be applied to a head-up display (HUD) and the like, in addition to a head-mounted display (HMD) and a projector configured as described above.

The image display device 1 and the virtual image display apparatus of the present disclosure are described above based on the illustrated embodiments, however, the present disclosure is not limited to the embodiments.

For example, in the image display device 1 and the virtual image display apparatus of the present disclosure, the constitutional elements may be replaced with any element that can exhibit similar functionality, or an element having any configuration may be added.

Further, in the above-described embodiments, cases are described in which the image display device 1 includes an organic EL element as a self-luminous element, however, in the present disclosure, the self-luminous element may be constituted by, for example, a light-emitting diode (LED), a micro light-emitting diode (LED), or the like, without being limited to an organic EL element.

In addition, in the above-described embodiments, cases are described in which the first light-emitting element 15 included in the image display device 1 emits the first image light LR of red color, the second light-emitting element 25 emits the second image light LB of blue color, and the third light-emitting element 35 emits the third image light LG of green color, to thus cause the image display device 1 to emit image light of full color, the present disclosure is not limited to the cases, and the image light emitted from the first light-emitting element 15, the second light-emitting element 25, and the third light-emitting element 35 may be of a combination of various colors, depending on the colors of the image light emitted from the image display device 1.

Next, specific examples of the present disclosure will be described below.

1. Manufacture of Light-Emitting Element

Example 1

Manufacture of Red Light-Emitting Element

<1> First, a transparent glass substrate having the average thickness of 0.5 mm was prepared. Next, a first power supply conductor, that is, a reflective film composed of AlCu having the average thickness of 150 nm was formed on the substrate by a sputtering method.

<2> Next, an $SiO_2$ layer having the average thickness of 30 nm, an SiN layer having the average thickness of 30 nm, and an $SiO_2$ layer having the average thickness of 30 nm were formed sequentially on the reflective film by a sputtering method, to thus form an optical adjustment layer constituted by a laminated body in which these layers are layered.

<3> Next, a first electrode, that is, a transparent electrode composed of ITO having the average thickness of 20 nm was formed on the optical adjustment layer by a sputtering method.

Then, the substrate constituted by these layers was immersed in acetone and 2-propanol in this order, and was treated with ultrasonic cleaning. Then, oxygen plasma treatment and argon plasma treatment were conducted on the resultant substrate. These plasma treatments were each performed at a plasma power of 100 W, a gas flow rate of 20 sccm, and a treatment time of 5 sec in a state where the substrate is heated at a temperature from not lower than 70° C. to not higher than 90° C.

<4> Next, on the transparent electrode, the hexacyano-hexaazatriphenylene represented by Formula (8) above and N4,N4'-(biphenyl-4,4'-diyl)bis(N4,N4',N4'-triphenylbiphenyl-4,4'-diamine) represented by Formula (1) below were deposited by a vacuum deposition method to form a hole injection layer having the average thickness of 125 nm.

[Formula 4]

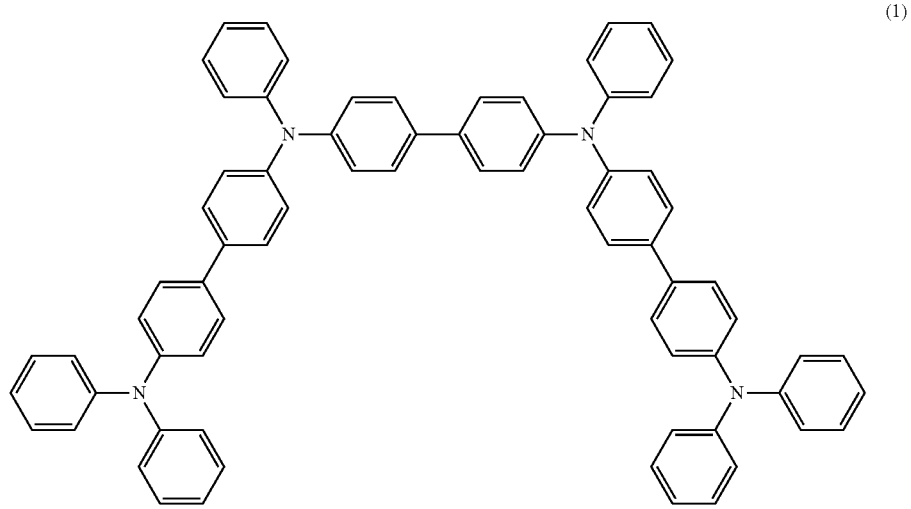

(1)

<5> Next, N4,N4'-(biphenyl-4,4'-diyl)bis(N4,N4',N4'-triphenylbiphenyl-4,4'-diamine) was deposited by a vacuum deposition method on the hole injection layer to form a hole transport layer having the average thickness of 10 nm.

<6> Next, constituent materials of the light-emitting layer were deposited on the hole transport layer by a vacuum deposition method to form a light-emitting layer having the average thickness of 30 nm. As the constituent materials of the light-emitting layer, a tetraaryldiindenoperylene derivative such as that represented by Formula (2) below was used as a luminescent material (a guest material) and a tetracene derivative such as that represented by Formula (3) below was used as a host material. Further, the content (doping concentration) of the luminescent material (a dopant) in the light-emitting layer was designated as 1.0 wt %.

[Formula 5]

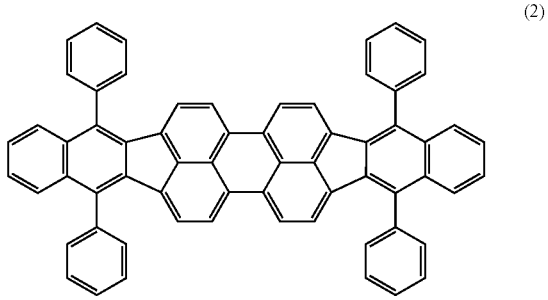

(2)

[Formula 6]

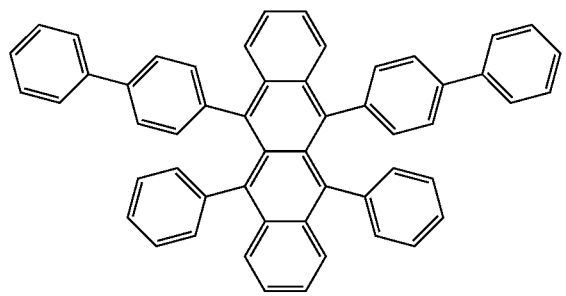

(3)

<7> Next, an azaindolizine derivative, 2,9-dimethyl-4,7-diphenyl-1,10-phenanthroline (BCP) such as that represented by Formula (4) below was deposited on the light-emitting layer by a vacuum deposition method to form an electron transport layer having the average thickness of 40 nm.

[Formula 7]

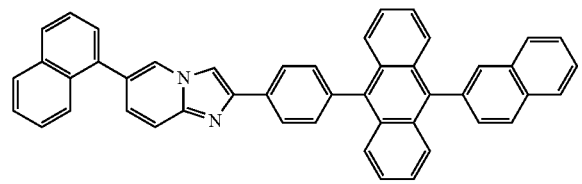

(4)

<8> Next, LiF was deposited on the electron transport layer by a vacuum deposition method to form an electron injection layer having the average thickness of 1 nm composed of LiF.

<9> Next, MgAg was deposited on the electron injection layer by a vacuum deposition method to form a second electrode, that is, a semireflective semitransmissive electrode having the average thickness of 20 nm composed of MgAg.

<10> Next, a glass protective cover (a sealing member) was placed to cover the formed layers, and was fixed and sealed with an epoxy resin.

The red light-emitting element was manufactured through the above-described steps.

Manufacture of Blue Light-Emitting Element

The blue light-emitting element was manufactured in the same manner as the red light-emitting element except that in the step<4>, N4,N4'-(biphenyl-4,4'-diyl)bis(N4,N4',N4'-triphenylbiphenyl-4,4'-diamine) was deposited on the transparent electrode by a vacuum deposition method to form a hole injection layer having the average thickness of 40 nm, in the step<6>, a distyryldiamine compound represented by Formula (5) below was used as a luminescent material (a guest material), and an anthracene derivative such as that represented by Formula (6) below was used as a host material, with the content (doping concentration) of the luminescent material (a dopant) of 6.0 wt %, to form a light-emitting layer, and in the step<7>, an electron transport layer having the average thickness of 20 nm was formed.

[Formula 8]

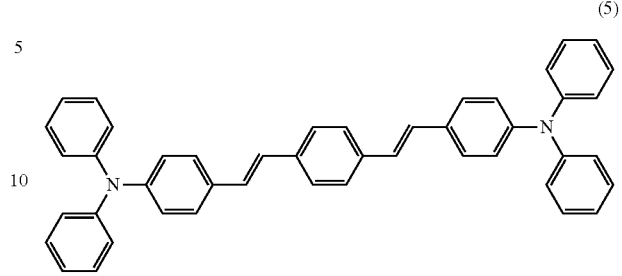

(5)

[Formula 9]

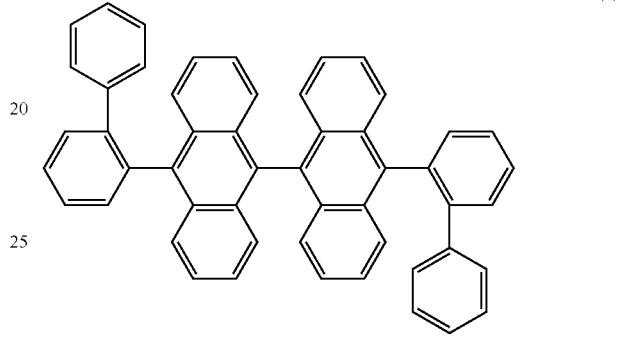

(6)

Manufacture of Green Light-Emitting Element

The blue light-emitting element was manufactured in the same manner as the red light-emitting element except that in the step<4>, a hole injection layer having the average thickness of 70 nm was formed on the transparent electrode, in the step<6>, a quinacridone derivative represented by Formula (7) below was used as a luminescent material (a guest material) and an anthracene derivative such as that represented by Formula (6) above was used as a host material to form a light-emitting layer, and in the step<7>, an electron transport layer having the average thickness of 30 nm was formed.

[Formula 10]

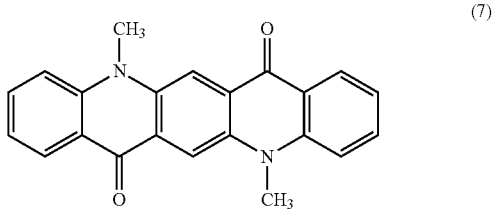

(7)

Example 2 and Reference Example

As listed in Table 1, the red light-emitting element, the blue light-emitting element, and the green light-emitting element of Example 2 and Reference Example were manufactured in the same manner as in the above-described Example 1 except that the formation of the layers constituting the red light-emitting element, the blue light-emitting element, and the green light-emitting element were omitted or the thicknesses of the layers were altered.

2. Evaluation

As for the red light-emitting element, the blue light-emitting element, and the green light-emitting element of the examples and reference example, a constant current power source (Keithley2400 available from Keithley Instruments, Inc.) was used to cause a constant current of 100 mA/cm$^2$ to flow through the light-emitting elements. Then, the driving voltage at this time was measured.

These measurement results are listed in Table 1.

TABLE 1

| | | | Example 1 | | | Example 2 | | | Reference Example | | |
|---|---|---|---|---|---|---|---|---|---|---|---|
| | | | Red light-emitting element | Blue light-emitting element | Green light-emitting element | Red light-emitting element | Blue light-emitting element | Green light-emitting element | Red light-emitting element | Blue light-emitting element | Green light-emitting element |
| Organic EL element | Semitransmissive Semireflective Electrode (Cathode) | MgAg (nm) | | 20 | | | 20 | | | 20 | |
| | Light-emitting functional layer | Electron injection layer (nm) | | 1 | | | 1 | | | 1 | |
| | | Electron transport layer (nm) | 40 | 20 | 30 | 40 | 20 | 30 | 40 | 20 | 30 |
| | | Light-emitting layer (nm) | 30 | 30 | 30 | 30 | 30 | 30 | 30 | 30 | 30 |
| | | Hole transport layer (nm) | 10 | 10 | 10 | 20 | 20 | 20 | 30 | 50 | 40 |
| | | Hole injection layer (nm) | 125 | 40 | 70 | 45 | 10 | 25 | — | — | — |
| Substrate | Transparent electrode (Anode) | ITO (nm) | | 20 | | | — | | | 20 | |
| | Optical adjustment layer | SiO$_2$ (nm) | | 30 | | | — | | 155 | 30 | 75 |
| | | SiN (nm) | | 30 | | | — | | 30 | 30 | 30 |
| | | SiO$_2$ (nm) | | 30 | | | — | | 30 | 30 | 30 |
| | Reflective film | AlCu (nm) | | 150 | | | 150 | | | 150 | |
| Evaluation | Driving Voltage (@100 mA/cm$^2$) | (mV) | 5.6 | 5.5 | 5.6 | 5.3 | 5.3 | 5.5 | 5.2 | 5.5 | 5.4 |

As is apparent from Table 1, in the red light-emitting element, the blue light-emitting element, and the green light-emitting element of the examples, the optimization of the optical path length between the first power supply conductor being a reflective film and the second electrode being a semireflective semitransmissive electrode was performed by altering the thickness of the light-emitting functional layer including a light-emitting layer. In contrast, in the red light-emitting element, the blue light-emitting element, and the green light-emitting element of the reference example, the optimization of the optical path length between the first power supply conductor being a reflective film and the second electrode being a semireflective semitransmissive electrode was performed by altering the thickness of the optical adjustment layer.

As described above, the methods for optimizing the optical path length differ between the examples and reference example, however, even when the optimization was achieved by altering the thickness of the light-emitting functional layer as in the examples, the results were obtained in which the red light-emitting element, the blue light-emitting element, and the green light-emitting element can be driven with the same driving voltage as in the case where the optimization of the optical path length was achieved by altering the thickness of the optical adjustment layer as in the reference example.

What is claimed is:

1. An image display device comprising:
a first self-luminous display element that self-emits an image of first color light having a peak in a first color region;
a second self-luminous display element that self-emits an image of second color light having a peak in a second color region;
a third self-luminous display element that self-emits an image of third color light having a peak in a third color region;
a prism including a first dichroic mirror and a second dichroic mirror that synthesize three colors of the first color light emitted from the first self-luminous display element, the second color light emitted from the second self-luminous display element, and the third color light emitted from the third self-luminous display element, the first dichroic mirror configured to transmit light having a wavelength of 550 nm or less and reflect light having a wavelength of 600 nm or greater, and the second dichroic mirror configured to transmit light having a wavelength of 520 nm or greater and reflect light having a wavelength of 490 nm or less; and
prism adhesive layers for bonding the respective self-luminous display elements to respective surfaces of the prism,
wherein the first self-luminous display element, the second self-luminous display element, and the third self-luminous display element each include a support substrate, a reflective film that is disposed between the support substrate and the prism, a light-emitting layer that is disposed between the reflective film and the prism, a semireflective semitransmissive electrode that is disposed between the light-emitting layer and the prism, and a coloring layer that is disposed between the semireflective semitransmissive electrode and the prism, and the first color light, the second color light, and the third color light are extracted from the semireflective semitransmissive electrode side,
the first self-luminous display element includes a first functional layer including the light-emitting layer and a first substrate portion including the reflective film, the second self-luminous display element includes a second functional layer including the light-emitting layer and a second substrate portion including the reflective film, and the third self-luminous display element includes a third functional layer including the light-emitting layer and a third substrate portion including the reflective film, the first substrate portion, the second substrate portion, and the third substrate portion have a same configuration in thickness directions thereof, the first functional layer, the second functional layer, and the third functional layer each have a mutually different film thickness, and the light-emitting layer of the first functional layer, the light-emitting layer of the second functional layer, and the light-emitting layer of the third functional layer each have a mutually different film thickness.

2. The image display device according to claim 1, wherein each of the reflective films in the first substrate portion, the second substrate portion, and the third substrate portion has a same film thickness.

3. The image display device according to claim 1, wherein the first substrate portion, the second substrate portion, and the third substrate portion each include a transparent electrode, and each of the transparent electrodes in the first substrate portion, the second substrate portion, and the third substrate portion has a same film thickness.

4. The image display device according to claim 1, wherein the first substrate portion, the second substrate portion, and the third substrate portion each include an optical adjustment layer, and each of the optical adjustment layers in the first substrate portion, the second substrate portion, and the third substrate portion has a same film thickness.

5. The image display device according to claim 1, wherein the first self-luminous display element, the second self-luminous display element, and the third self-luminous display element are each an organic electroluminescent element, the first functional layer, the second functional layer, and the third functional layer each have a hole transport layer, and each of the hole transport layers in the first functional layer, the second functional layer, and the third functional layer has a mutually different film thickness.

6. The image display device according to claim 5, wherein the first functional layer, the second functional layer, and the third functional layer each have an electron transport layer, and the hole transport layer in each of the first functional layer, the second functional layer, and the third functional layer has a film thickness greater than a sum of a film thickness of the electron transport layer and a film thickness of the light-emitting layer.

7. The image display device according to claim 5, wherein the hole transport layer in each of the first functional layer, the second functional layer, and the third functional layer is constituted of a laminated body of two or more layers.

8. The image display device according to claim 7, wherein the hole transport layer in each the first functional layer, the second functional layer, and the third functional layer is constituted of the laminated body of a mixed layer containing a hole transport material and a hole injection material, and a single layer containing a hole transport material.

9. The image display device according to claim 1, wherein the first color light, the second color light, and the third color light are red color light, blue color light, and green color light, respectively.

10. A virtual image display apparatus, comprising the image display device according to claim 1.

11. The image display device according to claim 1, wherein the coloring layer and a blocking layer are disposed adjacent to one another in a display region and a peripheral region, respectively, in a length direction of each of the self-luminous display elements.

12. The image display device according to claim 11, wherein the first self-luminous display element further includes a first cover substrate having light-transmissivity fixed with a first adhesive layer to the coloring layer and the blocking layer, the second self-luminous display element further includes a second cover substrate having light-transmissivity fixed with a second adhesive layer to the coloring layer and the blocking layer, and the third self-luminous display element further includes a third cover substrate having light-transmissivity fixed with a third adhesive layer to the coloring layer and the blocking layer.

13. The image display device according to claim 11, wherein the prism adhesive layers overlap the respective coloring layers and blocking layers disposed adjacent to one another in the display region and the peripheral region, respectively, in a length direction of each of the self-luminous display elements.

14. The image display device according to claim 11, wherein, in a light-emitting direction of each of the self-luminous display elements, the reflective film, a transparent electrode, the light-emitting layer, the semireflective semitransmissive electrode, the coloring layer, and an adhesive layer, are disposed in this order.

15. The image display device according to claim 1, wherein, in a thickness direction of each of the self-luminous display elements, a transparent electrode is provided between the reflective film and an adhesive layer, the semireflective semitransmissive electrode is provided between the transparent electrode and the adhesive layer, the light-emitting layer is provided between the transparent electrode and the semireflective semitransmissive electrode, and the coloring layer is provided between the semireflective semitransmissive electrode and the adhesive layer.

16. The image display device according to claim 1, wherein the prism adhesive layers extend across an entire length of the respective self-luminous display elements and surfaces of the prism.

17. The image display device according to claim 1, wherein each of the functional layers is constituted by a laminated body in which an electron injection layer, an electron transport layer, a light-emitting layer, a hole transport layer, and a hole injection layer are layered in this order from a side of the respective semireflective semitransmissive electrodes.

18. The image display device according to claim 1, wherein the first functional layer is constituted by a laminated body in which an electron injection layer having a thickness of 1 nm, an electron transport layer having a thickness of 40 nm, a light-emitting layer having a thickness of 30 nm, a hole transport layer having a thickness in a range of 10 to 20 nm, and a hole injection layer having a thickness in a range of 45 to 125 nm are layered in this order from a side of the semireflective semitransmissive electrode of the first self-luminous display element, the second functional layer is constituted by a laminated body in which an electron injection layer having a thickness of 1 nm, an electron transport layer having a thickness of 20 nm, a light-emitting layer having a thickness of 30 nm, a hole transport layer having a thickness in a range of 10 to 20 nm, and a hole injection layer having a thickness in a range of 10 to 40 nm are layered in this order from a side of the semireflective semitransmissive electrode of the second self-luminous display element, and the third functional layer is constituted by a laminated body in which an electron injection layer having a thickness of 1 nm, an electron transport layer having a thickness of 30 nm, a light-emitting layer having a thickness of 30 nm, a hole transport layer having a thickness in a range of 10 to 20 nm, and a hole injection layer having a thickness in a range of 25 to 70 nm are layered in this order from a side of the semireflective semitransmissive electrode of the third self-luminous display element.

19. The image display device according to claim 1, wherein the first self-luminous display element includes, layered in order from the surface of the prism, (i) the semireflective semitransmissive electrode composed of MgAg having a thickness of 20 nm, (ii) the first functional layer constituted by a laminated body in which an electron injection layer having a thickness of 1 nm, an electron transport layer having a thickness of 40 nm, a light-emitting layer having a thickness of 30 nm, a hole transport layer having a thickness in a range of 10 to 20 nm, and a hole injection layer having a thickness in a range of 45 to 125 nm, and (iii) the support substrate including a transparent electrode having a thickness of 20 nm, a first $SiO_2$ optical adjustment layer having a thickness of 30 nm, an SiN optical adjustment layer having a thickness of 30 nm, a second $SiO_2$ optical adjustment layer having a thickness of 30 nm, and the reflective film composed of AlCu and having a thickness of 150 nm, the second self-luminous display element includes, layered in order from the surface of the prism, (i) the semireflective semitransmissive electrode composed of MgAg having a thickness of 20 nm, (ii) the second functional layer constituted by a laminated body in which an electron injection layer having a thickness of 1 nm, an electron transport layer having a thickness of 20 nm, a light-emitting layer having a thickness of 30 nm, a hole transport layer having a thickness in a range of 10 to 20 nm, and a hole injection layer having a thickness in a range of 10 to 40 nm, and (iii) the support substrate including a transparent electrode having a thickness of 20 nm, a first $SiO_2$ optical adjustment layer having a thickness of 30 nm, an SiN optical adjustment layer having a thickness of 30 nm, a second $SiO_2$ optical adjustment layer having a thickness of 30 nm, and the reflective film composed of AlCu and having a thickness of 150 nm, and the third self-luminous display element includes, layered in order from the surface of the prism, (i) the semireflective semitransmissive electrode composed of MgAg having a thickness of 20 nm, (ii) the third functional layer constituted by a laminated body in which an electron injection layer having a thickness of 1 nm, an electron transport layer having a thickness of 30 nm, a light-emitting layer having a thickness of 30 nm, a hole transport layer having a thickness in a range of 10 to 20 nm, and a hole injection layer having a thickness in a range of 25 to 70 nm, and (iii) the support substrate including a transparent electrode having a thickness of 20 nm, a first $SiO_2$ optical adjustment layer having a thickness of 30 nm, an SiN optical adjustment layer having a thickness of 30 nm, a second $SiO_2$ optical adjustment layer having a thickness of 30 nm, and the reflective film composed of AlCu and having a thickness of 150 nm.

\* \* \* \* \*